(12) United States Patent
Sanekata

(10) Patent No.: US 10,895,595 B2
(45) Date of Patent: Jan. 19, 2021

(54) ELECTRONIC COMPONENT HANDLER AND ELECTRONIC COMPONENT TESTER

(71) Applicant: Seiko Epson Corporation, Tokyo (JP)

(72) Inventor: Takahito Sanekata, Shiojiri (JP)

(73) Assignee: Seiko Epson Corporation

( * ) Notice: Subject to any disclaimer, the term of this patent is extended or adjusted under 35 U.S.C. 154(b) by 148 days.

(21) Appl. No.: 16/177,588

(22) Filed: Nov. 1, 2018

(65) Prior Publication Data

US 2019/0128957 A1    May 2, 2019

(30) Foreign Application Priority Data

Nov. 2, 2017    (JP) ................................ 2017-212511

(51) Int. Cl.
| | | |
|---|---|---|
| *G06T 7/00* | (2017.01) | |
| *G01R 31/28* | (2006.01) | |
| *G06T 7/521* | (2017.01) | |
| *H05K 3/00* | (2006.01) | |

(52) U.S. Cl.
CPC ..... *G01R 31/2893* (2013.01); *G01R 31/2891* (2013.01); *G06T 7/001* (2013.01); *G06T 7/0008* (2013.01); *G06T 7/521* (2017.01); *H05K 3/0008* (2013.01); *G06T 2207/30141* (2013.01); *G06T 2207/30148* (2013.01)

(58) Field of Classification Search
CPC ....... G06T 7/001; G06T 7/521; G06T 7/0008; G01N 21/95607; G01B 9/023; G01B 11/2441; G02B 21/18; H01S 3/1305; H01S 3/2366; G01R 31/2893; G01R 31/2891

USPC ............ 382/145; 250/372, 310; 198/341.01; 356/237.5

See application file for complete search history.

(56) References Cited

U.S. PATENT DOCUMENTS

| | | | | |
|---|---|---|---|---|
| 2004/0124363 A1* | 7/2004 | Yoshida | ................ | G03F 7/7065 250/372 |
| 2009/0127068 A1* | 5/2009 | Ikeda | ................ | G01R 31/2891 198/341.01 |
| 2017/0200264 A1 | 7/2017 | Park et al. | | |

FOREIGN PATENT DOCUMENTS

| | | |
|---|---|---|
| TW | 201732305 A | 9/2017 |
| WO | WO-2007-017953 A1 | 2/2007 |

\* cited by examiner

*Primary Examiner* — Phuoc H Doan
(74) *Attorney, Agent, or Firm* — Harness, Dickey & Pierce, P.L.C.

(57) ABSTRACT

An electronic component handler includes: a placing plate on which an electronic component can be placed; a camera which picks up an image of the placing plate; a light source of a laser beam which casts the laser beam on the placing plate; and a processor for determining whether the electronic component is placed on the placing plate or not and which controls working of the camera and the light source of the laser beam when the processor carries out determination. When determining whether the electronic component is placed on the placing plate or not, the processor causes the camera to pick up an image of the placing plate in a state where the light source of the laser beam is casting the laser beam on the placing plate, and determines whether the electronic component is placed or not, based on a boundary of luminance in the image.

14 Claims, 11 Drawing Sheets

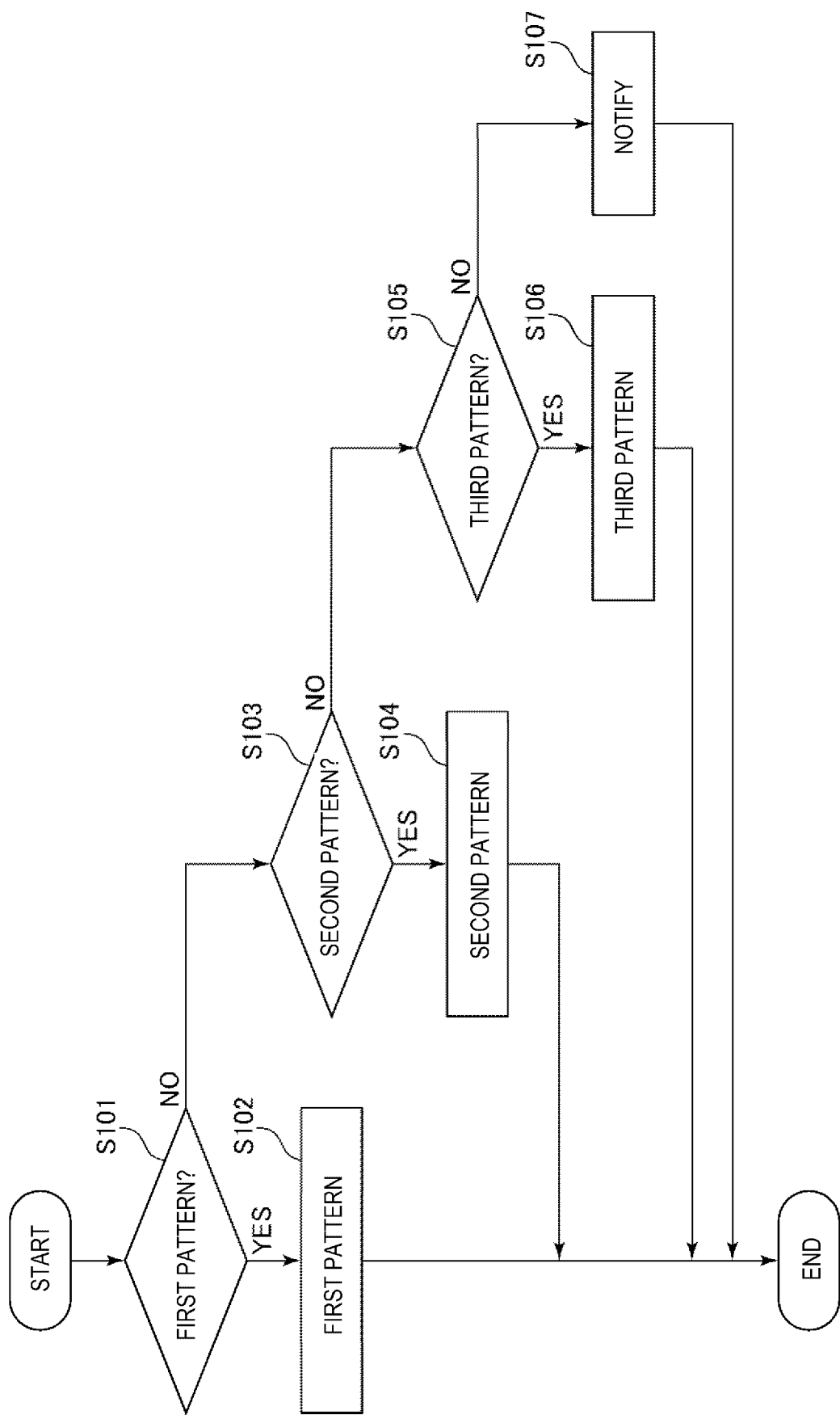

ELECTRONIC COMPONENT HANDLER AND ELECTRONIC COMPONENT TESTER

BACKGROUND

1. Technical Field

The present invention relates to an electronic component handler and an electronic component tester.

2. Related Art

According to the related art, an electronic component testing device which carries out an electrical test on an electronic component (test subject electronic component) such as an IC device is known (see, for example, WO07/017953). The electronic component testing device disclosed in WO07/017953 is configured to place an electronic component in a socket and carryout a test on the electronic component. The electronic component testing device disclosed in WO07/017953 also determines whether an electronic component remains in the socket, that is, the presence/absence of an electronic component, before testing an electronic component. This determination is necessary because if an electronic component remains in the socket, an electronic component to be tested is laid over the remaining electronic component and this may lead to failure to obtain accurate test results. The electronic component testing device disclosed in WO07/017953 acquires an image of the socket, compares this image with a determination reference image, and determines the presence/absence of an electronic component, based on the result of the comparison.

However, with the electronic component testing device disclosed in WO07/017953, if the image pickup environment (inside the space where the socket is installed) is dark, the image used to determine the presence/absence of an electronic component is black as a whole and therefore an electronic component, if any, hardly appears or does not appear at all in the image. In this case, the image cannot be compared with the determination reference image, thus posing a problem in that the presence/absence of an electronic component cannot be determined accurately.

SUMMARY

An advantage of some aspects of the invention is to solve at least a part of the problems described above, and the invention can be implemented as the following configurations.

An electronic component handler according to an aspect of the invention includes: a carrying unit which carries an electronic component; a placing unit on which the electronic component is capable of being placed; an image pickup unit which picks up an image of the placing unit; a laser beam irradiation unit which casts a laser beam toward the placing unit; and a control unit which has a determination unit for determining whether the electronic component is placed on the placing unit or not and which controls working of the image pickup unit and the laser beam irradiation unit when the determination unit carries out determination. When determining whether the electronic component is placed on the placing unit or not, the determination unit acquires a grayscale image of the placing unit by causing the image pickup unit to pick up an image of the placing unit in a state where the laser beam irradiation unit is casting the laser beam on the placing unit, and determines whether the electronic component is placed or not, based on a boundary of luminance in the grayscale image.

With this configuration, the image pickup unit such as a camera picks up an actual grayscale image to be used to determine whether an electronic component is placed or not, and the determination unit can extract a boundary of luminance in this actual grayscale image. Based on the extracted boundary of luminance, whether an electronic component is placed on the placing unit or not can be accurately determined, for example, by template matching.

In the electronic component handler according to the aspect of the invention, it is preferable that, when determining whether the electronic component is placed on the placing unit or not, the determination unit acquires a grayscale image of the placing unit by causing the image pickup unit to pick up an image of the placing unit in a state where the laser beam irradiation unit is casting the laser beam on the placing unit, then extracts a boundary of luminance in the grayscale image, and determines whether the electronic component is placed or not, based on a result of the extraction of the boundary.

With this configuration, the image pickup unit such as a camera picks up an actual grayscale image to be used to determine whether an electronic component is placed or not, and the determination unit can extract a boundary of luminance in this actual grayscale image. Based on the extracted boundary of luminance, whether an electronic component is placed on the placing unit or not can be accurately determined, for example, by template matching. Subsequently, the electronic component handler can safely carry out the next operation (for example, placing an electronic component onto the placing unit on which no electronic component is placed yet).

It is preferable that the electronic component handler according to the aspect of the invention further includes a storage unit which stores in advance a reference grayscale image to serve as a reference for determining whether the electronic component is placed on the placing unit or not, and that the determination unit compares the reference grayscale image and the grayscale image and thus determines whether the electronic component is placed or not.

This configuration enables accurately determining whether an electronic component is placed on the placing unit or not.

In the electronic component handler according to the aspect of the invention, it is preferable that the reference grayscale image includes a first reference grayscale image acquired by causing the laser beam irradiation unit to cast the laser beam on the placing unit and causing the image pickup unit to pick up an image, in a state where the electronic component is present on the placing unit, and a second reference grayscale image acquired by causing the laser beam irradiation unit to cast the laser beam on the placing unit and causing the image pickup unit to pick up an image, in a state where the electronic component is absent from the placing unit.

This configuration enables accurately determining whether an electronic component is placed on the placing unit or not.

In the electronic component handler according to the aspect of the invention, it is preferable that the first reference grayscale image includes a plurality of reference grayscale images with different irradiation conditions of the laser beam.

This configuration enables accurately determining whether an electronic component is placed on the placing unit or not.

In the electronic component handler according to the aspect of the invention, it is preferable that the laser beam irradiation unit is configured to cast the laser beam having a linear irradiation shape on the placing unit.

Thus, the laser beam can be suitably used for illumination at the time of image pickup.

In the electronic component handler according to the aspect of the invention, it is preferable that the placing unit has a recess where the electronic component is accommodated, and that the laser beam having the linear irradiation shape is cast across the recess.

Thus, the laser beam can be suitably used for illumination at the time of image pickup.

In the electronic component handler according to the aspect of the invention, it is preferable that the laser beam irradiation unit is configured to cast the laser beam having a dot-like irradiation shape on the placing unit.

Thus, the laser beam can be suitably used for illumination at the time of image pickup.

In the electronic component handler according to the aspect of the invention, it is preferable that the placing unit has a recess where the electronic component is accommodated, and that the laser beam having the dot-like irradiation shape is cast toward a bottom part of the recess.

Thus, the laser beam can be suitably used for illumination at the time of image pickup.

It is preferable that the electronic component handler according to the aspect of the invention includes an auxiliary light irradiation unit which casts light with a lower illuminance than the laser beam toward the placing unit when the image pickup unit picks up an image of the placing unit.

This configuration enables preventing, for example, the peripheral environment from being too dark when picking up an image of the placing unit. Thus, it is possible to visually recognize that each part is operating when determining whether an electronic component is placed or not.

An electronic component tester according to another aspect of the invention includes: a carrying unit which carries an electronic component; a testing unit which has a placing unit on which the electronic component is capable of being placed and which can test the electronic component placed on the placing unit; an image pickup unit which picks up an image of the placing unit; a laser beam irradiation unit which casts a laser beam toward the placing unit; and a control unit which has a determination unit for determining whether the electronic component is placed on the placing unit or not and which controls working of the image pickup unit and the laser beam irradiation unit when the determination unit carries out determination. When determining whether the electronic component is placed on the placing unit or not, the determination unit acquires a grayscale image of the placing unit by causing the image pickup unit to pick up an image of the placing unit in a state where the laser beam irradiation unit is casting the laser beam on the placing unit, and determines whether the electronic component is placed or not, based on a boundary of luminance in the grayscale image.

With this configuration, the image pickup unit such as a camera picks up an actual grayscale image to be used to determine whether an electronic component is placed or not, and the determination unit can extract a boundary of luminance in this actual grayscale image. Based on the extracted boundary of luminance, whether an electronic component is placed on the placing unit or not can be accurately determined, for example, by template matching.

Also, an electronic component can be carried to the testing unit and therefore the testing unit can test the electronic component. The tested electronic component can be carried from the testing unit.

BRIEF DESCRIPTION OF THE DRAWINGS

The invention will be described with reference to the accompanying drawings, wherein like numbers reference like elements.

FIG. 16 is a flowchart showing a control program for a control unit built in an electronic component tester according to a second embodiment of the invention.

DESCRIPTION OF EXEMPLARY EMBODIMENTS

Hereinafter, the electronic component handler and the electronic component tester according to the invention will be described with reference to preferred embodiments illustrated in the accompanying drawings.

First Embodiment

Figure 1:
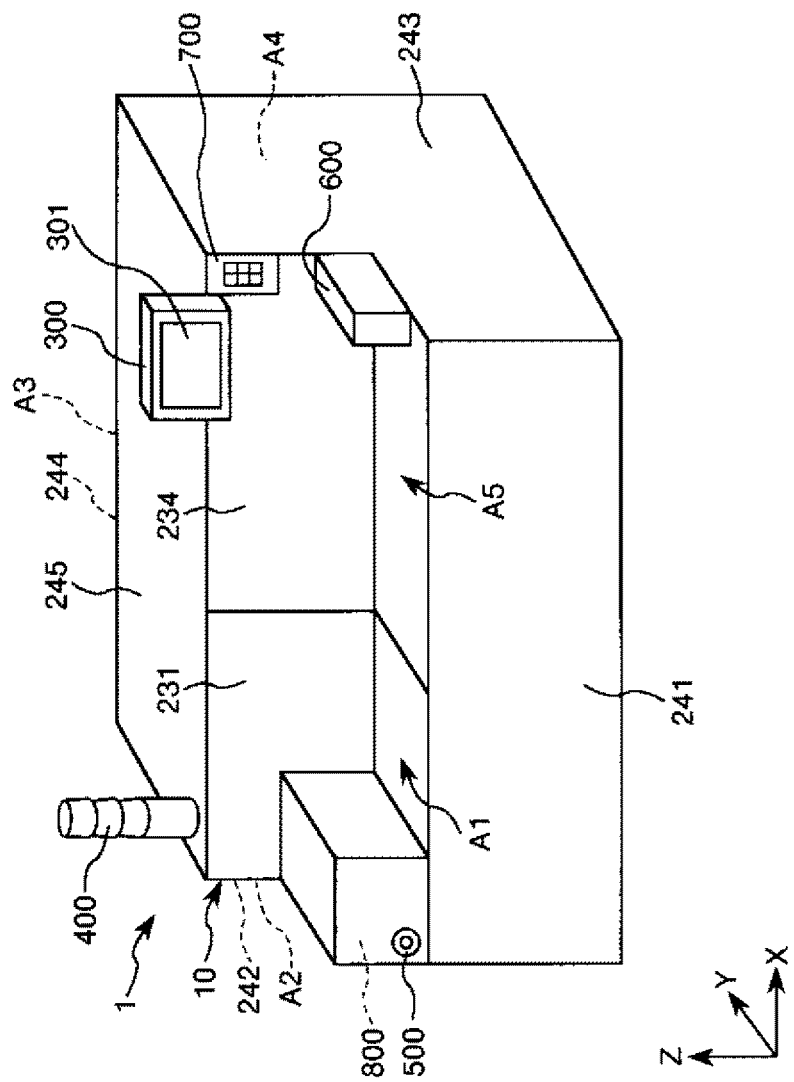
FIG. 1 is a schematic perspective view showing an electronic component tester according to a first embodiment of the invention, as viewed from the front.

A first embodiment of the electronic component handler and the electronic component tester according to the invention will now be described with reference to FIGS. 1 to 15. In the description below, for the sake of convenience of the description, three axes orthogonal to each other are defined as X-axis, Y-axis, and Z-axis, as shown in FIG. 1. An XY plane including the X-axis and the Y-axis is horizontal. The Z-axis is vertical. A direction parallel to the X-axis is also referred to as "X-direction (first direction)". A direction parallel to the Y-axis is also referred to as "Y-direction (second direction)". A direction parallel to the Z-axis is also referred to as "Z-direction (third direction)". In each of these directions, the side pointed by an arrow is referred to as "positive". The opposite side is referred to as "negative". The term "horizontal" in this specification is not limited to complete horizontally and includes being slightly tilted from horizontal (for example, by less than ±5° or so), provided that the carrying of an electronic component is not obstructed. The upper side in FIGS. 1, 4 and 5, that is, the positive side in the Z-axis direction may be referred to as "up" or "upper". The lower side, that is, the negative side in the Z-axis direction, may be referred to as "down" or "lower".

An electronic component handler 10 according to this embodiment has an appearance shown in FIG. 1. The electronic component handler 10 according to this embodiment includes: a carrying unit 25 which carries an IC device 90 as an electronic component; a placing unit 29 where the IC device 90 (electronic component) can be placed; an image pickup unit 26 which picks up an image of the placing unit 29; a laser beam irradiation unit 27 which casts a laser beam LB27 toward the placing unit 29; and a control unit 800 which has a determination unit 803 for determining whether the IC device 90 (electronic component) is placed on the placing unit 29 or not and which controls working of the image pickup unit 26 and the laser beam irradiation unit 27 when the determination unit 803 carries out determination. When determining whether the IC device 90 (electronic component) is placed on the placing unit 29 or not, the determination unit 803 acquires an actual grayscale image 5 (grayscale image) of the placing unit 29 by causing the image pickup unit 26 to pick up an image of the placing unit 29 in the state where the laser beam irradiation unit 27 is casting the laser beam LB27 on the placing unit 29 as illumination light for image pickup. The grayscale image is a picked-up image of the placing unit 29. Particularly, the grayscale image is an image in which the luminance of one pixel is different from the luminance of another pixel (that is, an image with light and shade). However, the grayscale image may be an image in which all pixels have the same luminance (for example, black). Any picked-up image of the placing unit 29 may be employed. The determination unit 803 can determine whether the IC device 90 (electronic component) is placed or not, based on a boundary of luminance in the actual grayscale image 5 (grayscale image) (for example, a boundary 511 or the like in an actual grayscale image 51A).

In this embodiment, a testing unit 16 is employed as an example of the "placing unit 29" to be used to determine the presence/absence of the IC device 90. However, this is not limiting. As the "placing unit 29", for example, a tray 200, a temperature adjustment unit 12, a device supply unit 14, a device collection unit 18, a collection tray 19 and the like can be employed as well as the testing unit 16.

According to this embodiment, the actual grayscale image 51A can be picked up using the image pickup unit 26 such as a camera, and this actual grayscale image 51A can be compared with reference grayscale images 4 (first reference grayscale image 41A, first reference grayscale image 41B, first reference grayscale image 41C, and second reference grayscale image 42), as described later. Then, the reference grayscale images 4 can be searched to find a reference grayscale image 4 (first reference grayscale image 41A) that has a boundary coinciding with the boundary 511, for example, by template matching. If the result of the search is the first reference grayscale image 41A, the actual grayscale image 51A is regarded as closely resembling the first reference grayscale image 41A and it is determined that the IC device 90 is present on the testing unit 16. In this way, the determination unit 803 can accurately determine whether the IC device 90 is placed on the testing unit 16 or not, based on the result of the extraction of the boundary 511.

Figure 2:
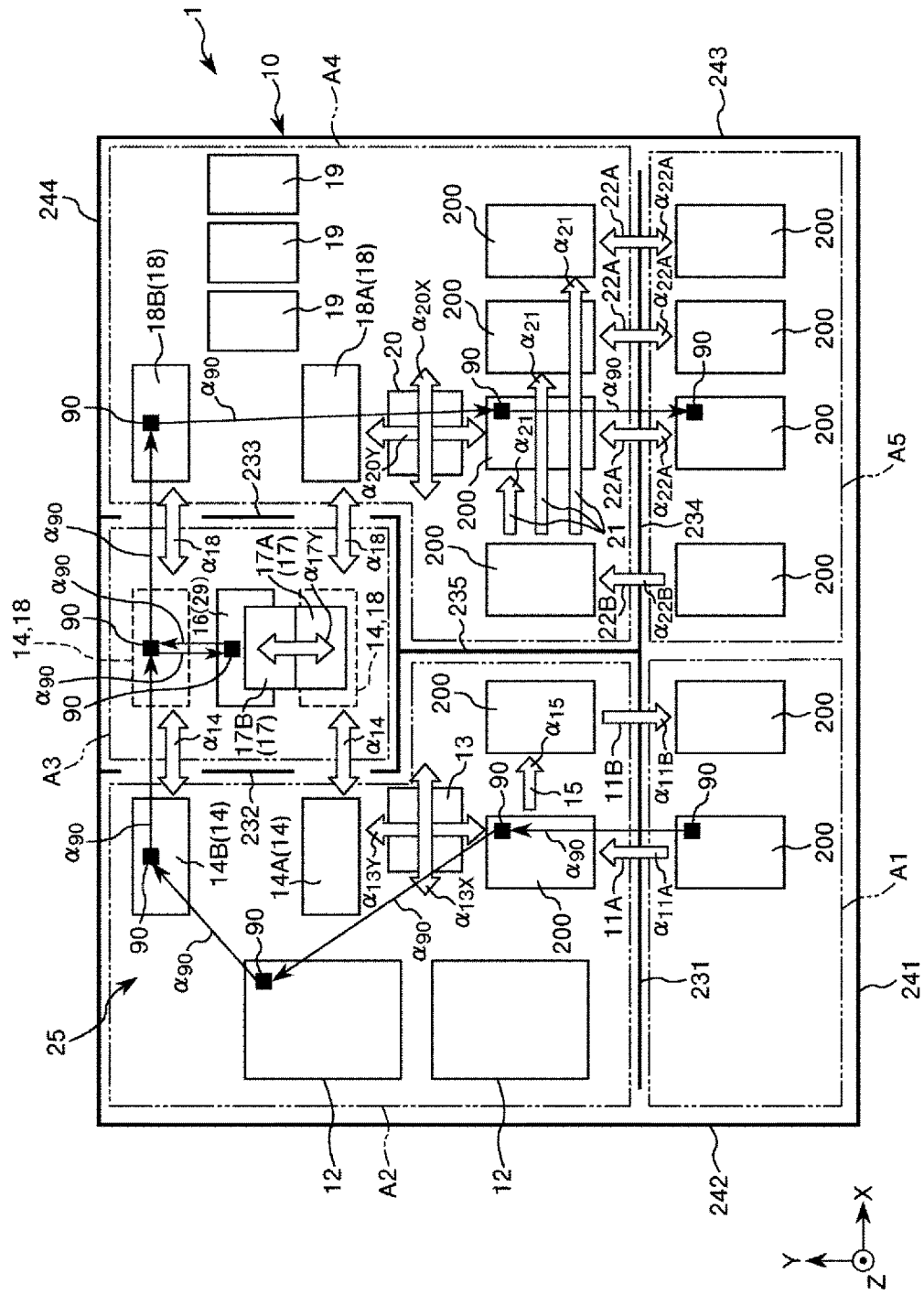
FIG. 2 is a schematic plan view showing the operation state of the electronic component tester shown in FIG. 1.

As shown in FIG. 2, an electronic component tester 1 according to this embodiment has the electronic component handler 10 and also has a testing unit 16 which tests an electronic component. That is, the electronic component tester 1 according to this embodiment includes: a carrying unit 25 which carries an IC device 90 as an electronic component; a testing unit 16 which has a placing unit 29 where the IC device 90 (electronic component) can be placed and which can test the IC device 90 (electronic component) placed on the placing unit 29; an image pickup unit 26 which picks up an image of the placing unit 29; a laser beam irradiation unit 27 which casts a laser beam LB27 toward the placing unit 29; and a control unit 800 which has a determination unit 803 for determining whether the IC device 90 (electronic component) is placed on the placing unit 29 or not and which controls working of the image pickup unit 26 and the laser beam irradiation unit 27 when the determination unit 803 carries out determination. When determining whether the IC device 90 (electronic component) is placed on the placing unit 29 or not, the determination unit 803 acquires an actual grayscale image 5 (grayscale image) of the placing unit 29 by causing the image pickup unit 26 to pick up an image of the placing unit 29 in the state where the laser beam irradiation unit 27 is casting the laser beam LB27 on the placing unit 29 as illumination light for image pickup. The determination unit 803 can determine whether the IC device 90 (electronic component) is placed or not, based on a boundary of luminance in the actual grayscale image 5 (grayscale image) (for example, a boundary 511 or the like in an actual grayscale image 51A).

Thus, the electronic component tester 1 having the advantages of the electronic component handler 10 is provided. Also, since the IC device 90 (electronic component) can be carried to the testing unit 16, the testing unit 16 can test the IC device 90. The tested IC device 90 can be carried from the testing unit 16.

The configuration of each part will now be described in detail.

As shown in FIGS. 1 and 2, the electronic component tester 1 having the electronic component handler 10 carries an electronic component such as an IC device, for example, a BGA (ball grid array) packet, and carries out an electrical test and check (hereinafter simply referred to as "test") on the electronic component in the process of carrying. In the description below, for the sake of convenience of the description, the case where an IC device is used as the electronic component is described as a representative example. This IC device is the "IC device 90". The IC device 90 in this embodiment is flat-shaped.

The IC device may also be, for example, an "LSI (large scale integration)", "CMOS (complementary MOS)", "CCD (charge-coupled device)", "module IC" made up of a plurality of modules packaged as an IC device, "quartz crystal device", "pressure sensor", "inertial sensor (acceleration sensor)", "gyro sensor", "fingerprint sensor" or the like, as well as the foregoing IC device.

The electronic component tester 1 (electronic component handler 10) has a tray supply area A1, a device supply area A2, a test area A3, a device collection area A4, a tray removal area A5. These areas are marked off by wall parts, as described later. The IC device 90 moves through these areas in order from the tray supply area A1 to the tray removal area A5 in the direction of arrows α90 and is tested in the test area A3 on its way. In this way, the electronic component tester 1 has the electronic component handler 10 having the carrying unit 25 carrying the IC device 90 through the respective areas, the testing unit 16 carrying out a test in the test area A3, and the control unit 800. The electronic component tester 1 also has a monitor 300, a signal lamp 400, and an operation panel 700.

When the electronic component tester 1 is in use, the side where the tray supply area A1 and the tray removal area A5 are arranged, that is, the lower side in FIG. 2, is the front side, and the side where the test area A3 is arranged, that is, the upper side in FIG. 2, is as the back side.

In the electronic component tester 1, what is called a "change kit" to be replaced by the type of the IC device 90 is loaded in advance. The change kit includes a placing unit (electronic component placing unit) where the IC device 90 (electronic component) is placed. In the electronic component tester 1 in this embodiment, the placing unit is installed at a plurality of positions. The placing units include, for example, the temperature adjustment unit 12, the device supply unit 14, and the device collection unit 18. The placing units (electronic component placing units), where the IC device 90 (electronic component) is placed, also include the tray 200 prepared by the user, the collection tray 19, and the testing unit 16, apart from the change kit as described above.

The tray supply area A1 is a feeding part supplied with the tray 200 on which a plurality of untested IC devices 90 is arranged. The tray supply area A1 can also be referred to as a loading area where a plurality of trays 200 can be stacked and loaded. In this embodiment, a plurality of recesses (pockets) is arranged in the form of a matrix on each tray 200. In each recess, one IC device 90 can be accommodated and placed.

The device supply area A2 is an area through which each of the plurality of IC devices 90 on a tray 200 carried from the tray supply area A1 is carried and supplied to the test area A3. Tray carrying mechanism 11A, 11B carrying the trays 200 one by one in the horizontal direction are provided, extending over the tray supply area A1 and the device supply area A2. The tray carrying mechanism 11A is a part of the carrying unit 25 and can move a tray 200 with the IC devices 90 placed thereon, to the positive side in the Y-direction, that is, in the direction of an arrow α11A. Thus, the IC devices 90 can be stably fed into the device supply area A2. The tray carrying mechanism 11B is a moving unit which can move an empty tray 200 to the negative side in the Y-direction, that is, in the direction of an arrow α11B. Thus, the empty tray 200 can be moved from the device supply area A2 to the tray supply area A1.

In the device supply area A2, the temperature adjustment unit 12 (soak plate), a device carrying head 13, and a tray carrying mechanism 15 are provided. Also, the device supply unit 14 moving to and from the device supply area A2 and the test area A3 is provided.

The temperature adjustment unit 12 has a placing unit on which a plurality of IC devices 90 is placed. The temperature adjustment unit 12 is called a "soak plate" that can heat or cool the placed IC devices 90 all together. This soak plate can heat or cool the IC devices 90 before the IC device 90 are tested at the testing unit 16, and thus can adjust the IC devices 90 to a suitable temperature for the test.

Such a temperature adjustment unit 12 as a placing unit is fixed. Thus, the temperature of the IC devices 90 can be stably adjusted on the temperature adjustment unit 12.

The temperature adjustment unit 12 is grounded.

In the configuration shown in FIG. 2, two temperature adjustment units 12 are arranged and fixed in the Y-direction. The IC devices 90 on the tray 200 carried in from the tray supply area A1 by the tray carrying mechanism 11A are carried to one of the temperature adjustment units 12.

The device carrying head 13 is a holding unit which holds and carries the IC device 90 and is supported in such away as to be movable in the device supply area A2. The device carrying head 13 is also a part of the carrying unit 25 and can carry the IC device 90 between the tray 200 carried in from the tray supply area A1 and the temperature adjustment units 12 and can also carry the IC device 90 between the temperature adjustment units 12 and the device supply unit 14, described later. In FIG. 2, the movement of the device carrying head 13 in the X-direction is indicated by an arrow α13X and the movement of the device carrying head 13 in the Y-direction is indicated by an arrow α13Y.

The device supply unit 14 forms a placing unit on which the temperature-adjusted IC device 90 is placed. The device supply unit 14 is also called a "supply shuttle plate" or simply a "supply shuttle" that can carry this IC device 90 to the vicinity of the testing unit 16. The device supply unit 14, too, can be a part of the carrying unit 25. The device supply unit 14 has a recess where the IC device 90 is accommodated and placed (the same applies to the device collection unit 18). The number of recesses provided is not particularly limited. If the number of recesses provided is plural, the number of recesses provided in the X-direction and the number of recess provided in the Y-direction are not particularly limited.

The device supply unit 14 as a placing unit is supported in such a way as to be able to reciprocate (move) in the X-direction between the device supply area A2 and the test area A3, that is, along the direction of an arrow α14. Thus, the device supply unit 14 can stably carry the IC device 90 from the device supply area A2 to the vicinity of the testing unit 16 in the test area A3. After the IC device 90 is removed by a device carrying head 17 in the test area A3, the device supply unit 14 can return to the device supply area A2 again.

In the configuration shown in FIG. 2, two device supply units 14 are arranged in the Y-direction. The device supply unit 14 on the negative side in the Y-direction may be referred to as "device supply unit 14A". The device supply unit 14 on the positive side in the Y-direction may be referred to as "device supply unit 14B". The IC devices 90 on the temperature adjustment units 12 are carried to the device supply unit 14A or the device supply unit 14B in the device supply area A2. Similarly to the temperature adjustment units 12, the device supply units 14 are configured to be able to heat or cool the IC devices 90 placed on the device supply units 14. Thus, the IC devices 90 whose temperature is adjusted by the temperature adjustment units 12 can be carried to the vicinity of the testing unit 16 in the test area A3, maintaining the temperature-adjusted state. Similarly to the temperature adjustment units 12, the device supply units 14 are grounded.

The tray carrying mechanism 15 is a mechanism which carries an empty tray 200, from which all IC devices 90 have been removed, to the positive side in the X-direction in the device supply area A2, that is, in the direction of an arrow α15. After being carried, the empty tray 200 is returns from the device supply area A2 to the tray supply area A1 by the tray carrying mechanism 11B.

The test area A3 is an area where the IC device 90 is tested. In the test area A3, the testing unit 16, which tests the IC device 90, and the device carrying head 17 are provided.

The device carrying head 17 is a part of the carrying unit 25. Similarly to the temperature adjustment units 12, the device carrying head 17 is configured to be able to heat or cool the IC device 90 held thereon. Thus, the device carrying head 17 can hold the IC device 90 maintained in the temperature-adjusted state, and can carry the IC device 90 within the test area A3, maintaining the temperature-adjusted state.

Such a device carrying head 17 is a part of a mechanism called an "index arm" supported in such a way as to be able to reciprocate in the Y-direction and the Z-direction within the test area A3. Thus, the device carrying head 17 can lift the IC device 90 from the device supply unit 14 carried in from the device supply area A2, and can carry and place the IC device 90 onto the testing unit 16.

In FIG. 2, the reciprocation of the device carrying head 17 in the Y-direction is indicated by an arrow α17Y. While the device carrying head 17 is supported in such a way as to be able to reciprocate in the Y-direction, this is not limiting. The device carrying head 17 may be supported in such a way as to be able to reciprocate in the X-direction as well. In the configuration shown in FIG. 2, two device carrying heads 17 are arranged in the Y-direction. The device carrying head 17 on the negative side in the Y-direction may be referred to as "device carrying head 17A". The device carrying head 17 on the positive side in the Y-direction may be referred to as "device carrying head 17B". The device carrying head 17A can carry the IC device 90 from the device supply unit 14A to the testing unit 16 within the test area A3. The device carrying head 17B can carry the IC device 90 from the device supply unit 14B to the testing unit 16 within the test area A3.

The testing unit 16 (socket) has the placing unit 29, where an IC device 90 as an electronic component is placed and an electrical property of the IC device 90 is tested. The testing unit 16 has a recess (pocket) 161 (see FIGS. 4 and 5) where the IC device 90 is accommodated and placed. A plurality of probe pins (not illustrated) is provided at a bottom part 162 of the recess 161. A terminal of the IC device 90 and the probe pins are connected in an electrically conductive manner, that is, come in contact with each other. This enables the testing of the IC device 90. The testing of the IC device 90 is carried out, based on a program stored in a test control unit provided in a tester connected to the testing unit 16.

Similarly to the temperature adjustment units 12, such a testing unit 16 can heat or cool the IC device 90 and adjust the IC device 90 to a suitable temperature for testing.

The number of recesses 161 provided is not particularly limited. If the number of recesses 161 provided is plural, the number of recesses 161 along the X-direction and the number of recesses 161 along the Y-direction are not particularly limited.

The device collection area A4 is an area where a plurality of IC devices 90 tested in the test area A3 and finished with the test are collected. In the device collection area A4, the collection tray 19, a device carrying head 20, and a tray carrying mechanism 21 are provided. Also, the device collection unit 18 moving to and from the test area A3 and the device collection area A4 is provided. An empty tray 200 is also prepared in the device collection area A4.

The device collection unit 18 is a placing unit on which the IC device 90 finished with the test at the testing unit 16 is placed and which can carry the IC device 90 to the device collection area A4. The device collection unit 18 is called a "collection shuttle plate" or simply a "collection shuttle". The device collection unit 18, too, can be a part of the carrying unit 25.

The device collection unit 18 is supported in such a way as to be able to reciprocate in the X-direction between the test area A3 and the device collection area A4, that is, along the direction of an arrow α18. In the configuration shown in FIG. 2, similarly to the device supply units 14, two device collection units 18 are arranged in the Y-direction. The device collection unit 18 on the negative side in the Y-direction may be referred to as "device collection unit 18A". The device collection unit 18 on the positive side in the Y-direction may be referred to as "device collection unit 18B". The IC device 90 on the testing unit 16 is carried to and placed on the device collection unit 18A or the device collection unit 18B. The device carrying head 17A carries the IC device 90 from the testing unit 16 to the device collection unit 18A. The device carrying head 17B carries the IC device from the testing unit 16 to the device collection unit 18B. Similarly to the temperature adjustment units 12 and the device supply units 14, the device collection units 18 are grounded.

The collection tray 19 is a placing unit on which the IC device 90 tested at the testing unit 16 is placed. The collection tray 19 is fixed so as not to move within the device collection area A4. Thus, even if a relatively large number of moving parts such as the device carrying head 20 is arranged in the device collection area A4, the tested IC device 90 is stably placed on the collection tray 19. In the configuration shown in FIG. 2, three collection trays 19 are arranged along the X-direction.

Similarly, three empty trays 200 are arranged along the X-direction. The empty trays 200, too, serve as placing units where the IC device 90 tested at the testing unit 16 is placed. The IC device 90 on the device collection unit 18 moved into the device collection area A4 is carried to and placed on one of the collection trays 19 and the empty trays 200. Thus, the IC devices 90 are classified and collected, based on the result of the test.

The device carrying head 20 is supported in such a way as to be movable in the X-direction and the Y-direction within the device collection area A4 and also has a part movable in the Z-direction. The device carrying head 20 is a part of the carrying unit 25 and can carry the IC device 90 from the device collection unit 18 to the collection trays 19 or the empty trays 200. In FIG. 2, the movement of the device carrying head 20 in the X-direction is indicated by an arrow α20X. The movement of the device carrying head 20 in the Y-direction is indicated by an arrow α20Y.

The tray carrying mechanism 21 is a mechanism which carries the empty tray 200 carried in from the tray removal area A5, in the X-direction within the device collection area A4, that is, in the direction of an arrow α21. After being thus carried, the empty tray 200 is arranged at a position where the IC device 90 is collected. That is, this empty tray 200 can be one of the foregoing three empty trays 200.

The tray removal area A5 is a removal part where the tray 200 with a plurality of tested IC devices 90 arranged thereon is collected and removed. In the tray removal area A5, a large number of trays 200 can be stacked.

A tray carrying mechanism 22A and a tray carrying mechanism 22B which carry the trays 200 one by one in the Y-direction are provided, extending over the device collection area A4 and the tray removal area A5. The tray carrying mechanism 22A is a part of the carrying unit 25 and is a moving unit which can move the tray 200 in reciprocating motion in the Y-direction, that is, in the direction of an arrow α22A. Thus, the tested IC device 90 can be carried from the device collection area A4 to the tray removal area A5. The tray carrying mechanism 22B can move the empty tray 200 for collecting the IC device 90, to the positive side in the Y-direction, that is, in the direction of an arrow α22B. Thus, the empty tray 200 can be moved from the tray removal area A5 to the device collection area A4.

Figure 3:
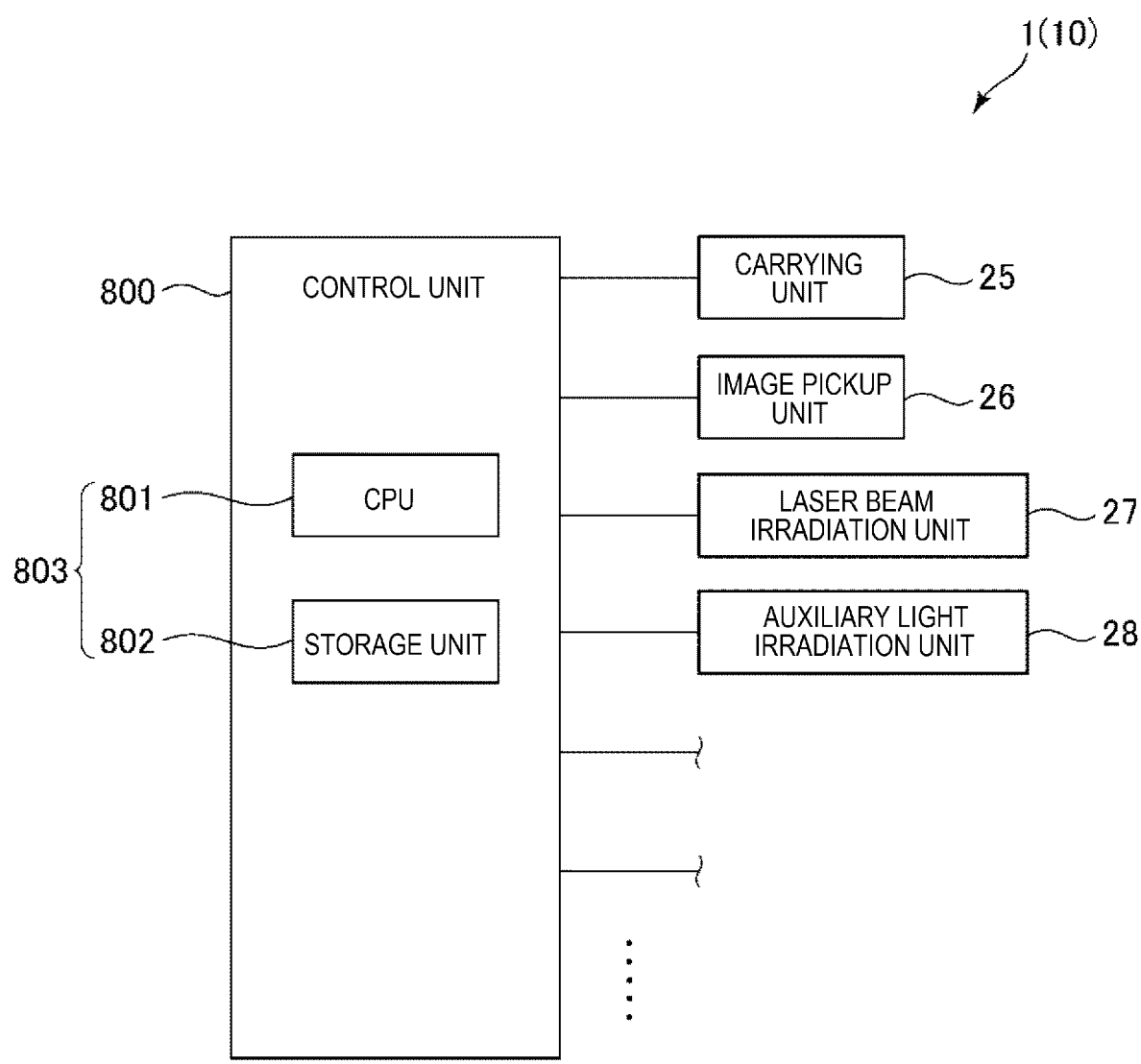
FIG. 3 is a block diagram showing essential parts of the electronic component tester shown in FIG. 1.

The control unit 800 can control, for example, working of the tray carrying mechanism 11A, the tray carrying mechanism 11B, the temperature adjustment unit 12, the device carrying head 13, the device supply unit 14, the tray carrying mechanism 15, the testing unit 16, the device carrying head 17, the device collection unit 18, the device carrying head 20, the tray carrying mechanism 21, the tray carrying mechanism 22A, and the tray carrying mechanism 22B, and working of the image pickup unit 26, the laser beam irradiation unit 27, and an auxiliary light irradiation unit 28, described later. As shown in FIG. 3, the control unit 800 has at least one processor, that is, a CPU (central processing unit) 801, and a storage unit 802. The CPU 801 can carry out, for example, various determinations and various commands or the like. The storage unit 802 stores, for example, various programs such as a program for carrying the IC device 90 from the tray supply area A1 to the tray removal area A5. The control unit 800 may be built in the electronic component tester 1 (electronic component handler 10) or may be provided in an external device such as an external computer. The external device may, for example, communicate with the electronic component tester 1 via a cable or the like, may wirelessly communicate with the electronic component tester 1, or may be connected to the electronic component tester 1 via a network (for example, the internet). The CPU 801 and the storage unit 802 may be, for example, integrated together and configured as one unit. The CPU 801 may be built in the electronic component tester 1, whereas the storage unit 802 may be provided in an external device such as an external computer. Alternatively, the storage unit 802 may be built in the electronic component tester 1, whereas the CPU 801 may be provided in an external device such as an external computer.

The operator can set and confirm operating conditions or the like of the electronic component tester 1 via the monitor 300. The monitor 300 has a display screen 301 made up of, for example, a liquid crystal screen, and is arranged in an upper part on the front side of the electronic component tester 1. As shown in FIG. 1, a mouse rest 600 where a mouse is placed is provided on the right side of the tray removal area A5 in the illustration. The mouse is used to operate a screen displayed on the monitor 300.

The operation panel 700 is arranged to the lower right from the monitor 300. The operation panel 700 is configured to instruct the electronic component tester 1 to execute a desired operation, apart from the monitor 300.

The signal lamp 400 can notify the working state or the like of the electronic component tester 1 by a combination of colors of light emitted. The signal lamp 400 is arranged in an upper part of the electronic component tester 1. Also, a speaker 500 is built in the electronic component tester 1 and can notify the working state or the like of the electronic component tester 1.

In the electronic component tester 1, the tray supply area A1 and the device supply area A2 are marked off from each other by a first partition wall 231. The device supply area A2 and the test area A3 are marked off from each other by a second partition wall 232. The test area A3 and the device collection area A4 are marked off from each other by a third partition wall 233. The device collection area A4 and the tray removal area A5 are marked off from each other by a fourth partition wall 234. The device supply area A2 and the device collection area A4 are marked off from each other by a fifth partition wall 235.

The electronic component tester 1 has its outermost shell covered with a cover. The cover includes, for example, a front cover 241, a side cover 242, a side cover 243, a rear cover 244, and a top cover 245.

As described above, the placing unit 29 where the IC device 90 can be placed within the test area A3 is the testing unit 16. Before testing the IC device 90 at the testing unit 16, the electronic component tester 1 detects whether an IC device 90 is placed in the recess 161 of the testing unit 16 or not, that is, whether an IC device 90 remains or not. Whether an IC device 90 remains or not is detected, for example, for the following reason.

If an IC device 90 remains in the recess 161 of the testing unit 16 (hereinafter this IC device 90 is referred to as "remaining device"), the next IC device 90 to be tested in this recess 161 (hereinafter this IC device 90 is referred to as "untested device") is placed over the remaining device. In such a state, it may be difficult to accurately test the untested device. Therefore, it is preferable that whether an IC device 90 remains or not is detected at the testing unit 16.

Figure 4:
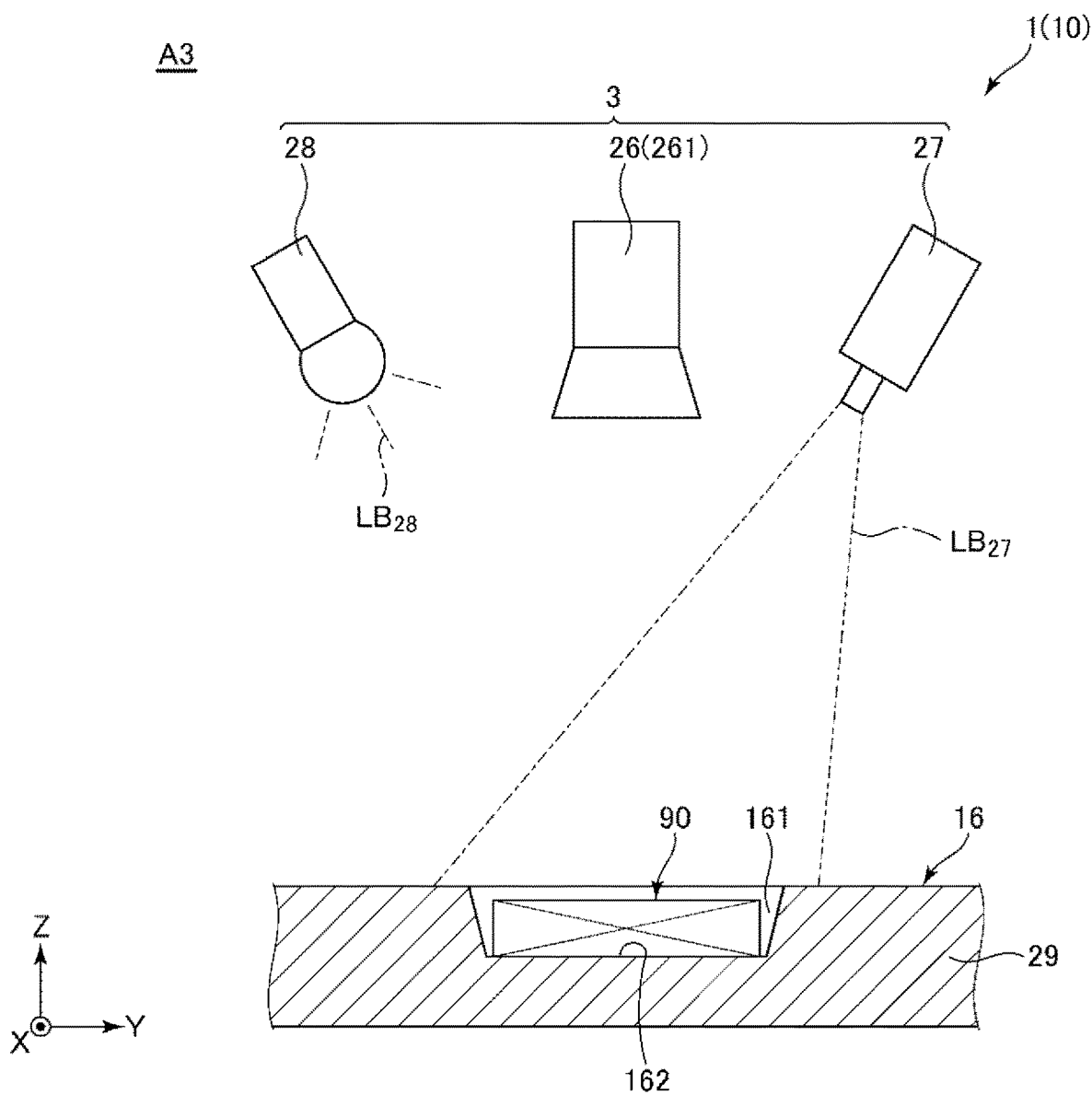
FIG. 4 is a partial vertical cross-sectional view showing the state where whether or not an IC device is placed on a testing unit in a testing area of the electronic component tester shown in FIG. 1 is determined.
Figure 5:
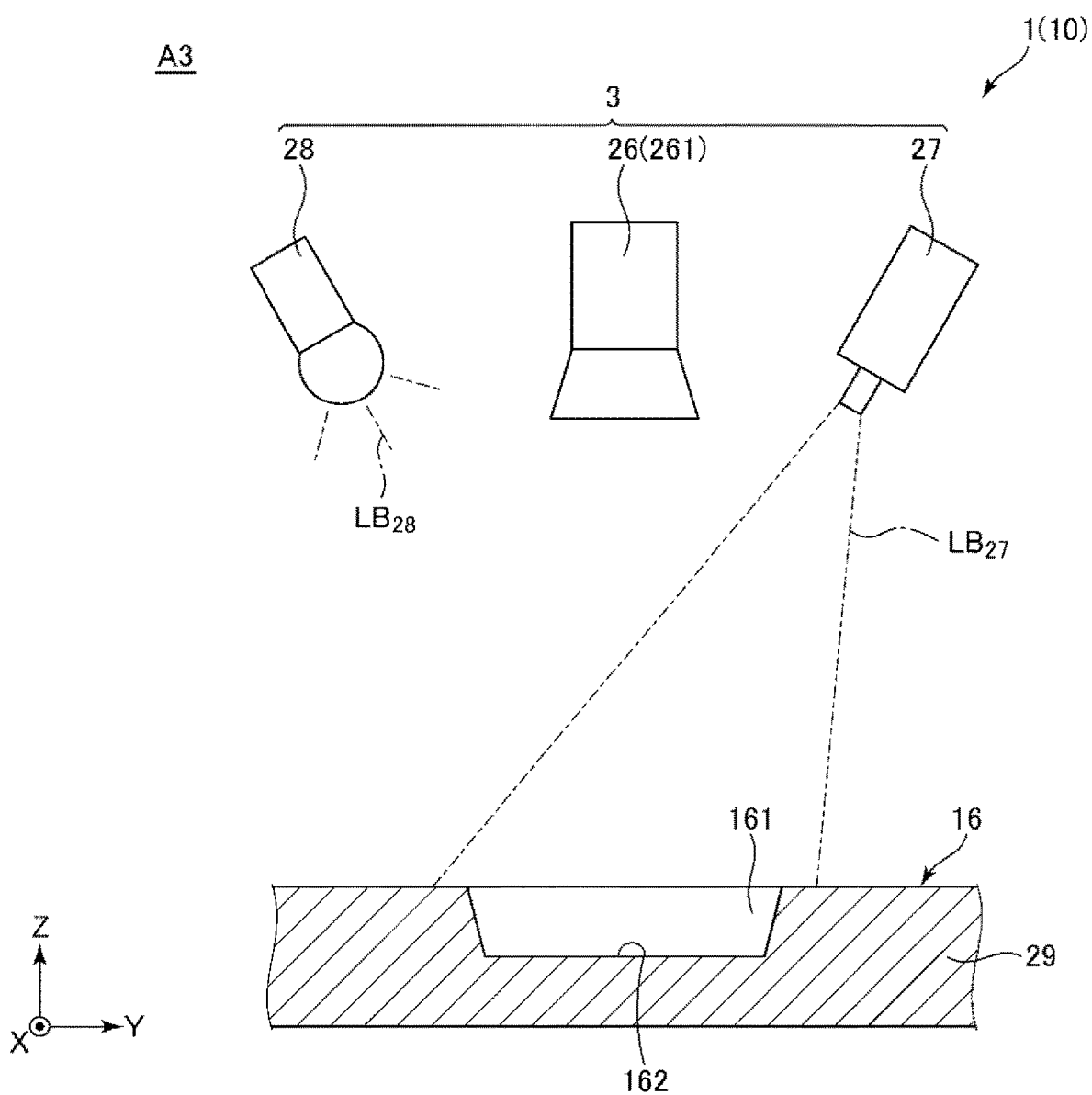
FIG. 5 is a partial vertical cross-sectional view showing the state where whether or not an IC device is placed on the testing unit in the testing area of the electronic component tester shown in FIG. 1 is determined.

Thus, the electronic component tester 1 has a remaining device detection unit 3 which detects whether an IC device 90 remains or not at the testing unit 16. As shown in FIGS. 4 and 5, the remaining device detection unit 3 includes: the image pickup unit 26, which picks up an image of the testing unit 16 (placing unit 29); the laser beam irradiation unit 27, which casts the laser beam LB27 (single-color light) toward the testing unit 16 (placing unit 29); and the auxiliary light irradiation unit 28, which casts light (hereinafter referred to as "auxiliary illumination light LB28") with a lower illuminance than the laser beam LB27 toward the testing unit 16 (placing unit 29).

The control unit 800, too, functions as a part of the remaining device detection unit 3. As described above, the control unit 800 has the CPU 801 and the storage unit 802. The CPU 801 commands, for example, working of the image pickup unit 26, the laser beam irradiation unit 27, the auxiliary light irradiation unit 28 and the like. The storage unit 802 can store in advance a reference grayscale image 4 to be a reference for determining whether an IC device 90 (electronic component) is placed on the testing unit 16 (placing unit 29) or not. The CPU 801 and the storage unit 802 form the determination unit 803. The determination unit 803 can determine whether an IC device 90 (electronic component) is placed on the testing unit 16 (placing unit 29).

As shown in FIGS. 4 and 5, the image pickup unit 26 is arranged and fixed to the upper side of the testing unit 16, that is, to the positive side in the Z-direction from the testing unit 16. The image pickup unit 26 is made up of at least one camera 261. The camera 261 faces downward (to the negative side in the Z-direction) and can pick up an image of the testing unit 16. Although the camera 261 faces downward, this is not limiting. For example, the camera 261 may face sideways (X-direction or Y-direction). If the camera 261 faces sideways, a prism may be arranged in that direction and the camera 261 may pick up an image of the testing unit 16 via the prism.

The camera 261 is not particularly limited, provided that the camera 261 can acquire a grayscale image. For example, a CCD (charge-coupled device) camera, three-dimensional camera or the like can be used.

The number of cameras 261 arranged is not particularly limited, provided that one or more cameras 261 are arranged. For example, if a plurality of cameras 261 is provided in each of the X-direction and the Y-direction, images picked up by the respective cameras 261 may be combined together to acquire an image of the entirety of the testing unit 16.

While the camera 261 is fixed in this embodiment, this is not limiting. For example, the camera 261 may be supported in such a way as to be rotatable. Thus, for example, the image pickup range of the camera 261 can be changed, or the total number of cameras 261 arranged can be minimized.

As shown in FIGS. 4 and 5, the laser beam irradiation unit 27 is arranged to the positive side in the Y-direction from the image pickup unit 26. The laser beam irradiation unit 27 can cast laser beam LB27. The laser beam LB27 is highly directional and can be cast accurately at a target position. In the illustrated configuration, the laser beam irradiation unit 27 can cast the laser beam LB27 obliquely on the testing unit 16. The number of laser beam irradiation units 27 arranged and the position where the laser beam irradiation unit 27 is arranged are not particularly limited, provided that the laser beam irradiation unit 27 can cast the laser beam LB27 on the testing unit 16.

The laser beam irradiation unit 27 may be fixed. However, it is preferable that the laser beam irradiation unit 27 is supported in such a way as to be rotatable, for example, about the X-axis or the Y-axis. Thus, the laser beam irradiation unit 27 can cast the laser beam LB27 on the recess 161, adjusting the angle of incidence to the testing unit 16 according to the number of recesses 161 arranged in the testing unit 16 and the position where the recess 161 is arranged, or the like.

It is also preferable that the laser beam irradiation unit 27 can cast the laser beam LB27, switching between two states. In a first state, the laser beam irradiation unit 27 can cast the laser beam LB27 as slit light along the Y-direction. In a second state, the laser beam irradiation unit 27 can cast the laser beam LB27 as spot light. Thus, the laser beam irradiation unit 27 can properly select and cast, for example, the laser beam LB27 suitable for the number of recesses 161 arranged in the testing unit 16, the position where the recess 161 is arranged, the size of the recess 161, and the type of the IC device 90 or the like. The method for switching the laser beam LB27 is not particularly limited. For example, changing a lens or the like can be employed.

The laser beam irradiation unit 27 is configured in such a way that, in the first state, the laser beam LB27 has a linear irradiation shape (projection shape) on the testing unit 16 (placing unit 29) (see FIGS. 6, 7, 9 to 11, and 13). As described above, the testing unit 16 (placing unit 29) has the recess 161, where the IC device 90 (electronic component) is accommodated. As shown in FIGS. 6, 7, 9 to 11, and 13, the laser beam LB27 with a linear irradiation shape is cast across the recess 161. Thus, the laser beam LB27 can be used as illumination at the time of image pickup. This can allow a boundary of luminance to stand out, which is a feature point that serves as a clue to determine whether an IC device 90 is placed or not. The "boundary of luminance" is, for example, a boundary 411 in FIG. 6, a boundary 412 in FIG. 7, a boundary 511 in FIG. 10, and a boundary 512 in FIG. 11.

Figure 8:
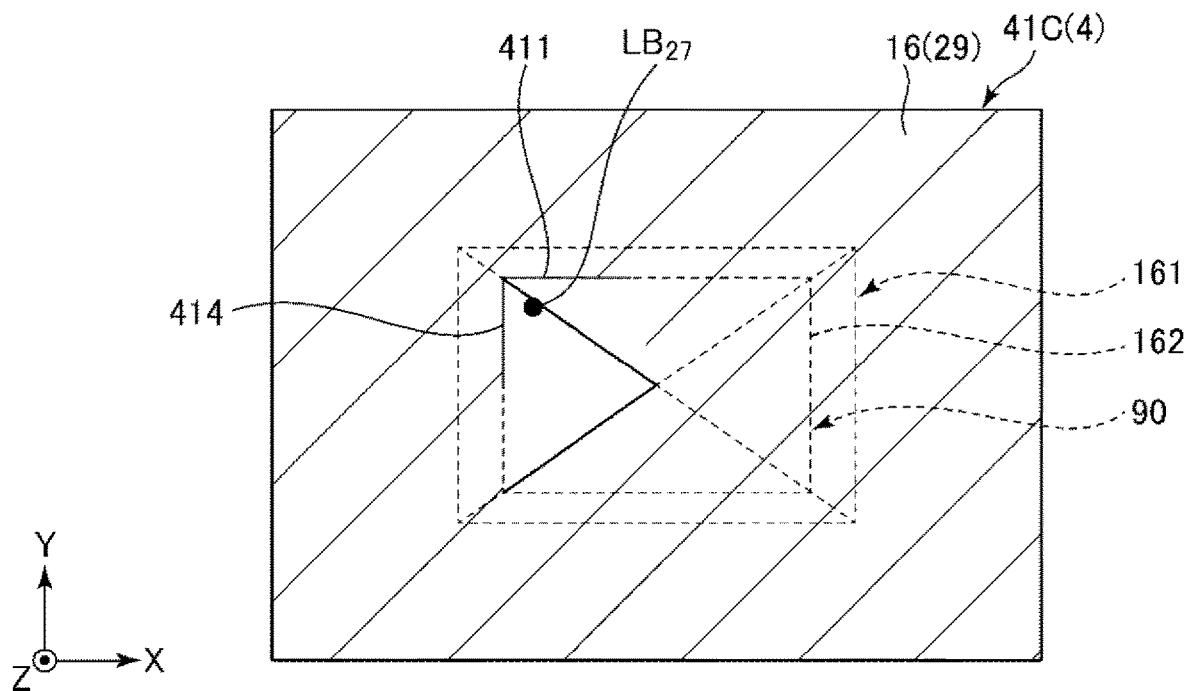
FIG. 8 is a first reference grayscale image (an example) used to determine whether an IC device is placed on the testing unit or not.
Figure 12:
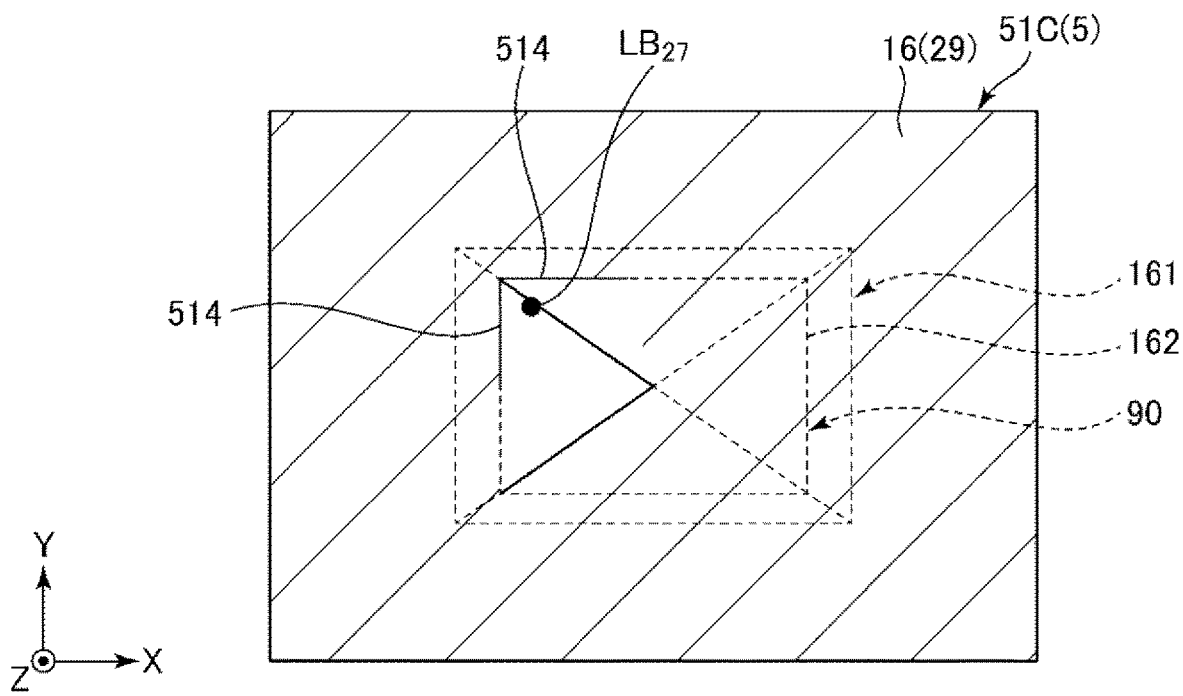
FIG. 12 is a grayscale image (an example) picked up by the image pickup unit when determining whether an IC device is placed on the testing unit or not.

The laser beam irradiation unit 27 is also configured in such a way that, in the second state, the laser beam LB27 has a dot-like irradiation shape (projection shape) on the testing unit 16 (placing unit 29) (see FIGS. 8 and 12). As described above, the testing unit 16 (placing unit 29) has the recess 161, where the IC device 90 (electronic component) is accommodated. As shown in FIGS. 8 and 12, the laser beam LB27 with a dot-like irradiation shape is cast toward the bottom part 162 of the recess 161. In this case, too, the laser beam LB27 can be used as illumination at the time of image pickup. This can allow a boundary of luminance to stand out, which is a feature point that serves as a clue to determine whether an IC device 90 is placed or not. The "boundary of luminance" is, for example, a boundary 414 in FIG. 8 and a boundary 514 in FIG. 12.

The wavelength of the laser beam LB27 is not particularly limited. For example, a visible range, that is, 380 nm or longer and 750 nm or shorter is preferable. A wavelength of 620 nm or longer and 750 nm or shorter is more preferable. A wavelength of 620 nm or longer and 680 nm or shorter is even more preferable.

As for the output value of the laser beam irradiation unit 27, for example, 1 mW or higher and 90 mW or lower is preferable, though it depends on the degree of lightness/darkness in the test area A3. An output value of 10 mW or higher and 90 mW or lower is more preferable. An output value of 75 mW or higher and 85 mW or lower is even more preferable.

The electronic component tester 1 (electronic component handler 10) has the auxiliary light irradiation unit 28, which casts light (auxiliary illumination light LB28) having a lower illuminance than the laser beam LB27 toward the testing unit 16 (placing unit 29) when the image pickup unit 26 picks up an image of the testing unit 16 (placing unit 29). The auxiliary illumination light LB28 can, for example, prevent it from becoming too dark in the test area A3, while restraining influence on the laser beam LB27 at the time of image pickup of the testing unit 16. Thus, it is possible to visually recognize the state where an operation to detect any remaining IC device 90 is being carried out. Other than at the time of image pickup of the testing unit 16, for example, when the operator wants to put a hand in the test area A3 to do work, the hand can be illuminated. This enables the operator to do work in the test area A3 safely and accurately.

As shown in FIGS. 4 and 5, the auxiliary light irradiation unit 28 is arranged to the opposite side of the image pickup unit 26 from the laser beam irradiation unit 27. However, the position where the auxiliary light irradiation unit 28 is arranged is not limited to the illustrated configuration.

The auxiliary illumination light LB28 is not particularly limited. For example, a light source with a built-in white LED can be used.

The remaining device detection unit 3 may also be configured without the auxiliary light irradiation unit 28.

The processing to detect any remaining IC device 90 in the recess 161 of the testing unit 16, that is, processing to determine the presence/absence of an IC device 90 (hereinafter simply referred to as "determination processing"), is carried out by the control unit 800. The determination processing uses a grayscale image of the testing unit 16 picked up by the image pickup unit 26.

Incidentally, in the test area A3, where the testing unit 16 is installed, structures such as the device carrying head 17, the image pickup unit 26, the laser beam irradiation unit 27, and the auxiliary light irradiation unit 28 are accommodated and arranged in addition to the testing unit 16. Therefore, even if the rear cover 244 has a window and light enters the test area A3 through this window, it is difficult for the light to sufficiently reach the testing unit 16 at the back of the test area A3. Picking up an image of the testing unit 16 in such a state without the laser beam LB27 from the laser beam irradiation unit 27 and the auxiliary illumination light LB28 from the auxiliary light irradiation unit 28 results in, for example, a grayscale image as shown in FIG. 14 or 15.

Figure 14:
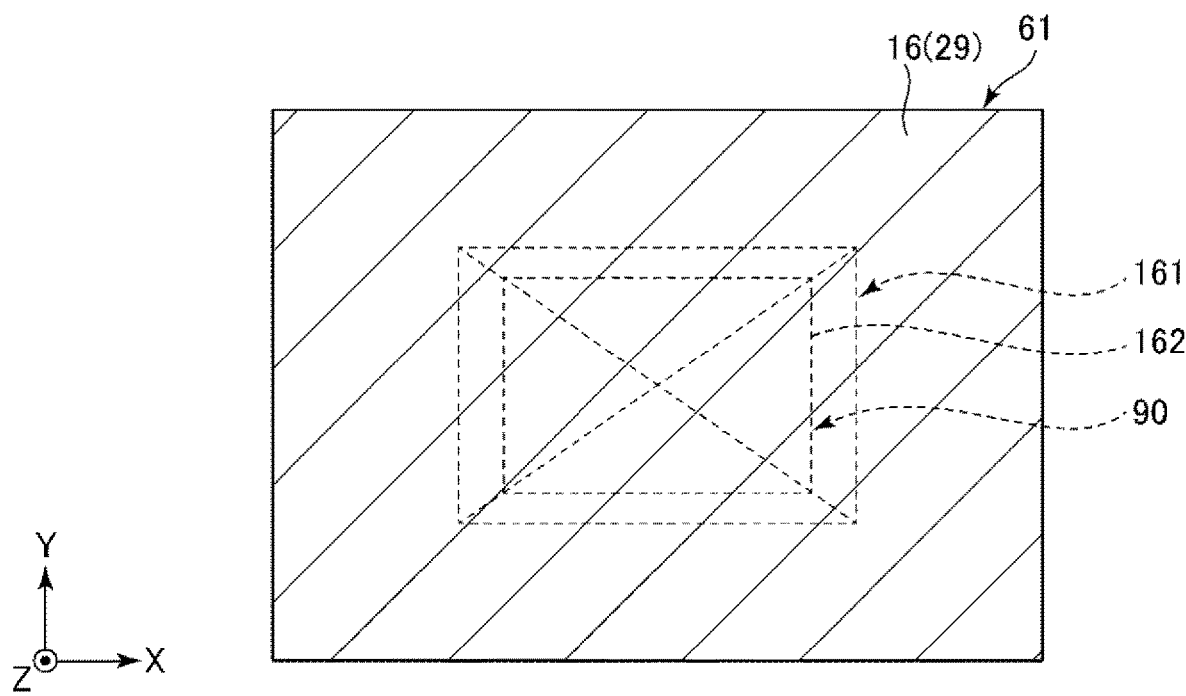
FIG. 14 is a grayscale image (an example) picked up by the image pickup unit in the state where no laser beam is cast on the testing unit.
Figure 15:
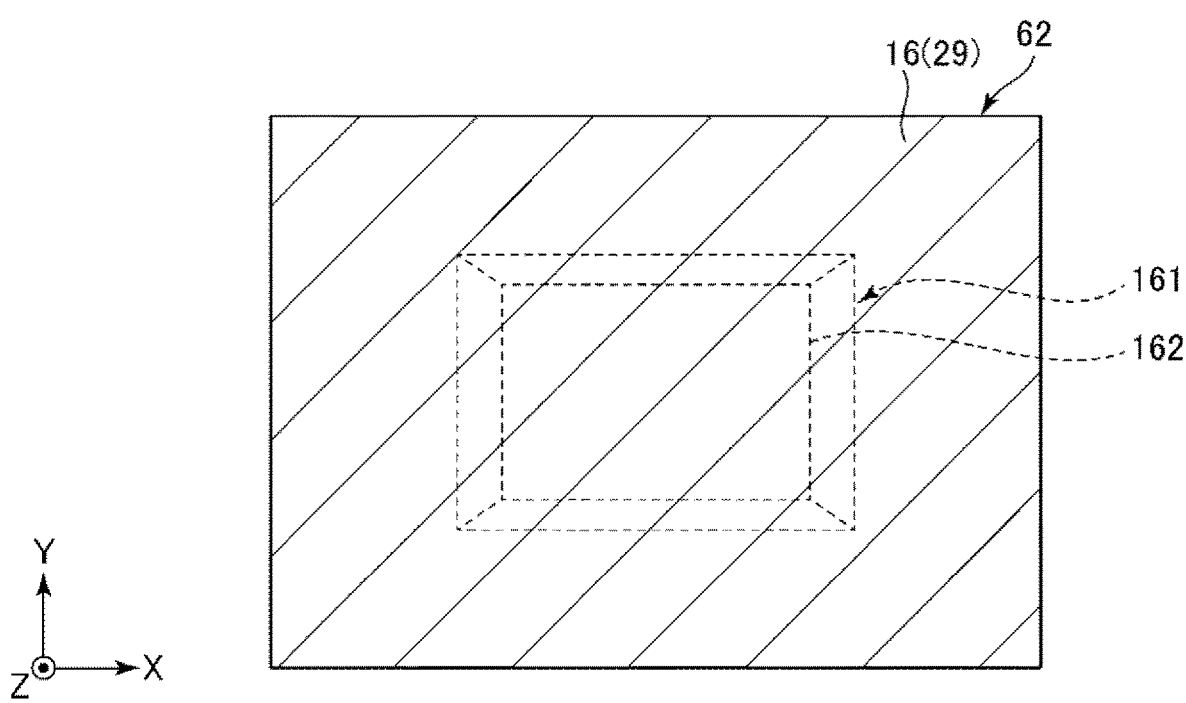
FIG. 15 is a grayscale image (an example) picked up by the image pickup unit in the state where no laser beam is cast on the testing unit.

A grayscale image 61 shown in FIG. 14 is obtained in the state where an IC device 90 is accommodated in the recess 161 of the testing unit 16. The grayscale image 61 lacks contrast as a whole and looks black. The IC device 90 is completely invisible or hardly visible. Meanwhile, a grayscale image 62 shown in FIG. 15 is obtained in the state where an IC device 90 is not accommodated in the recess 161 of the testing unit 16. The grayscale image 62 lacks contrast as a whole and looks black. The recess 161 is completely invisible or hardly visible. In practice, it is impossible to use such grayscale images 61, 62 for the determination processing.

Thus, the laser beam LB27 from the laser beam irradiation unit 27 is used as illumination light at the time of image pickup, so as to obtain a grayscale image having enough contrast to determine whether an IC device 90 is placed or not.

It is preferable that the auxiliary illumination light LB28 is cast from the auxiliary light irradiation unit 28 along with the laser beam LB27 cast from the laser beam irradiation unit 27. However, the auxiliary illumination light LB28 may be omitted. Omitting the laser beam LB27 from the laser beam irradiation unit 27 and using only the auxiliary illumination light LB28 from the auxiliary light irradiation unit 28 does not provide sufficient illumination light at the time of image pickup.

As described above, the electronic component tester 1 (electronic component handler 10) has the storage unit 802, which stores in advance the reference grayscale image 4 serving as a reference for determining whether an IC device 90 (electronic component) is placed on the testing unit 16 (placing unit 29) or not. The determination unit 803 can determine whether an IC device 90 (electronic component) is placed or not, by comparing the reference grayscale image 4 with the actual grayscale image 5 (grayscale image) to determine whether an IC device 90 is placed on the actual testing unit 16 or not.

The reference grayscale image 4 includes the first reference grayscale image 41A (see FIG. 6), the first reference grayscale image 41B (see FIG. 7) and the first reference grayscale image 41C (see FIG. 8) obtained by casting the laser beam LB27 from the laser beam irradiation unit 27 onto the testing unit 16 (placing unit 29) and picking up an image by the image pickup unit 26 in the state where an IC device 90 (electronic component) is present on the testing unit 16 (placing unit 29), and the second reference grayscale image 42 (see FIG. 9) obtained by casting the laser beam LB27 from the laser beam irradiation unit 27 onto the testing unit 16 (placing unit 29) and picking up an image by the image pickup unit 26 in the state where an IC device 90 (electronic component) is absent from the testing unit 16 (placing unit 29).

The first reference grayscale image 41A, the first reference grayscale image 41B, and the first reference grayscale image 41C are picked up with different irradiation conditions of the laser beam LB27 from each other. That is, the first reference grayscale image includes a plurality of first reference grayscale images with different irradiation conditions of the laser beam LB27 from each other. The irradiation conditions of the laser beam LB27 are not particularly limited and can be, for example, the angle of incidence of the laser beam LB27 on the recess 161 (position of irradiation with the laser beam LB27) and the illuminance of the laser beam LB27 or the like. While three first reference grayscale images are used in this embodiment, this is not limiting. For example, two, or four or more first reference grayscale images may be used. The first reference grayscale image is not limited to those shown in FIGS. 6 to 8. For example, those shown in FIGS. 6 to 8 may be superimposed on each other according to need.

Using the first reference grayscale image 41A, the first reference grayscale image 41B, the first reference grayscale image 41C, and the second reference grayscale image in the determination processing enables accurately determining whether an IC device 90 is placed on the testing unit 16 or not, as described later.

Figure 6:
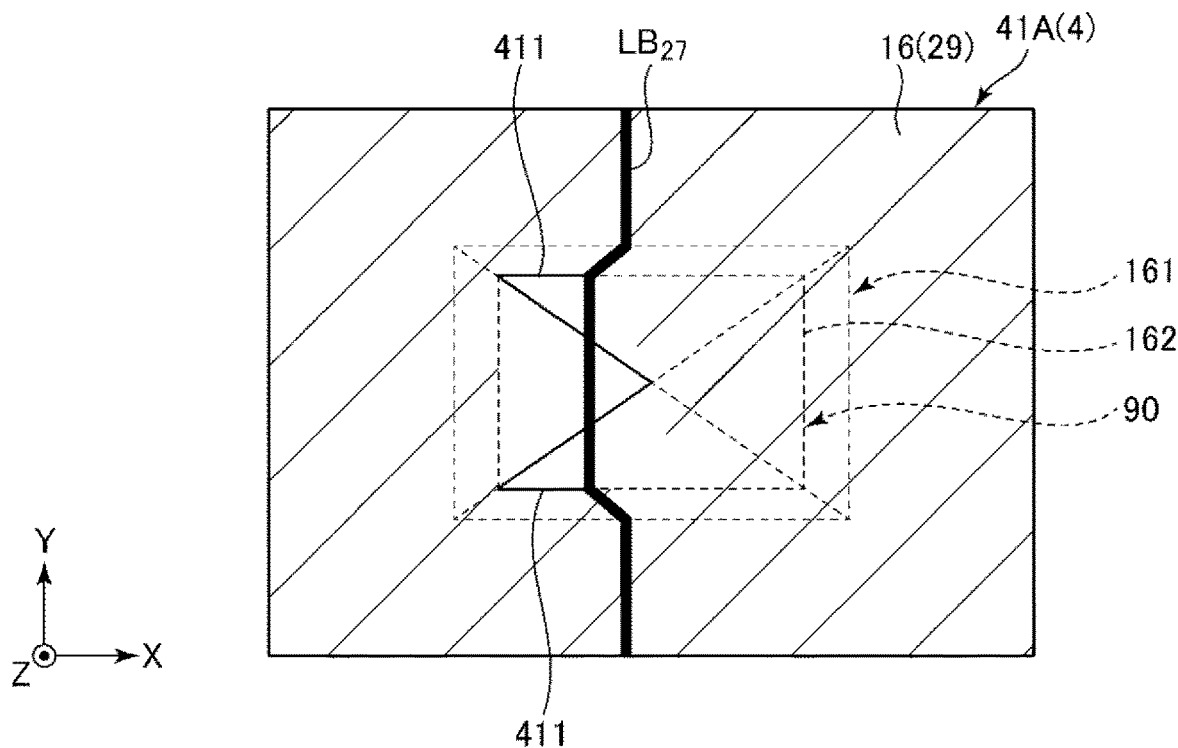
FIG. 6 is a first reference grayscale image (an example) used to determine whether an IC device is placed on the testing unit or not.

In the first reference grayscale image 41A shown in FIG. 6, a part of the upper surface of the IC device 90 is brightly illuminated with the laser beam LB27. With binarization, the boundary between the illuminated part and the other part, that is, the boundary 411 of luminance, stands out at least at one position. In the first reference grayscale image 41A, this boundary 411 can be regarded as a contour (edge) of the IC device 90.

Figure 7:
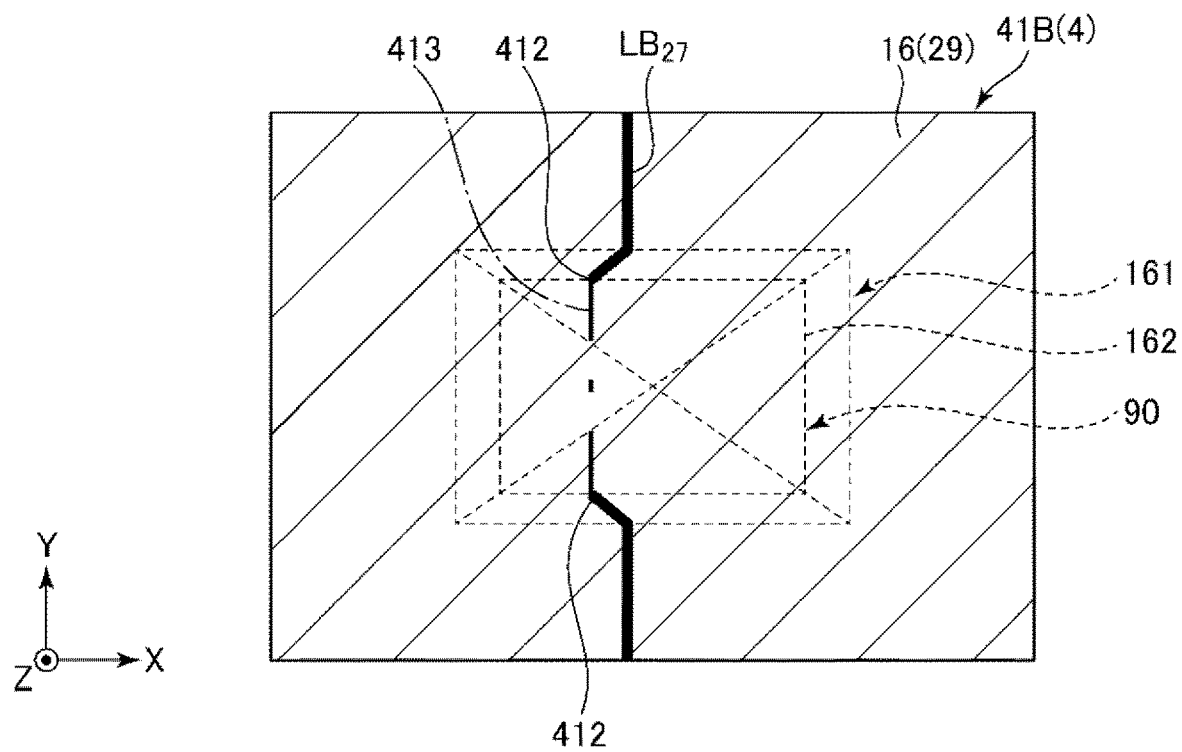
FIG. 7 is a first reference grayscale image (an example) used to determine whether an IC device is placed on the testing unit or not.

In the first reference grayscale image 41B shown in FIG. 7, the upper surface of the IC device 90 is not so illuminated with the laser beam LB27 as in the first reference grayscale image 41A, but its peripheries are brightly illuminated with the laser beam LB27. With binarization, the boundary between the part brightly illuminated with the laser beam LB27 and the other part, that is, the boundary 412 of luminance, stands out at least at one position. In the first reference grayscale image 41B, this boundary 412 can be regarded as a contour (edge) of the IC device 90. In the first reference grayscale image 41B, a gently illuminated part 413 of the upper surface of the IC device 90 can be handled as a marker indicating the upper surface of the IC device 90.

In the first reference grayscale image 41C shown in FIG. 8, a part of the upper surface of the IC device 90 is brightly illuminated with the laser beam LB27. With binarization, the boundary between the illuminated part and the other part, that is, the boundary 414 of luminance, stands out at least at one position. In the first reference grayscale image 41C, this boundary 414 can be regarded as a contour (edge) of the IC device 90.

Figure 9:
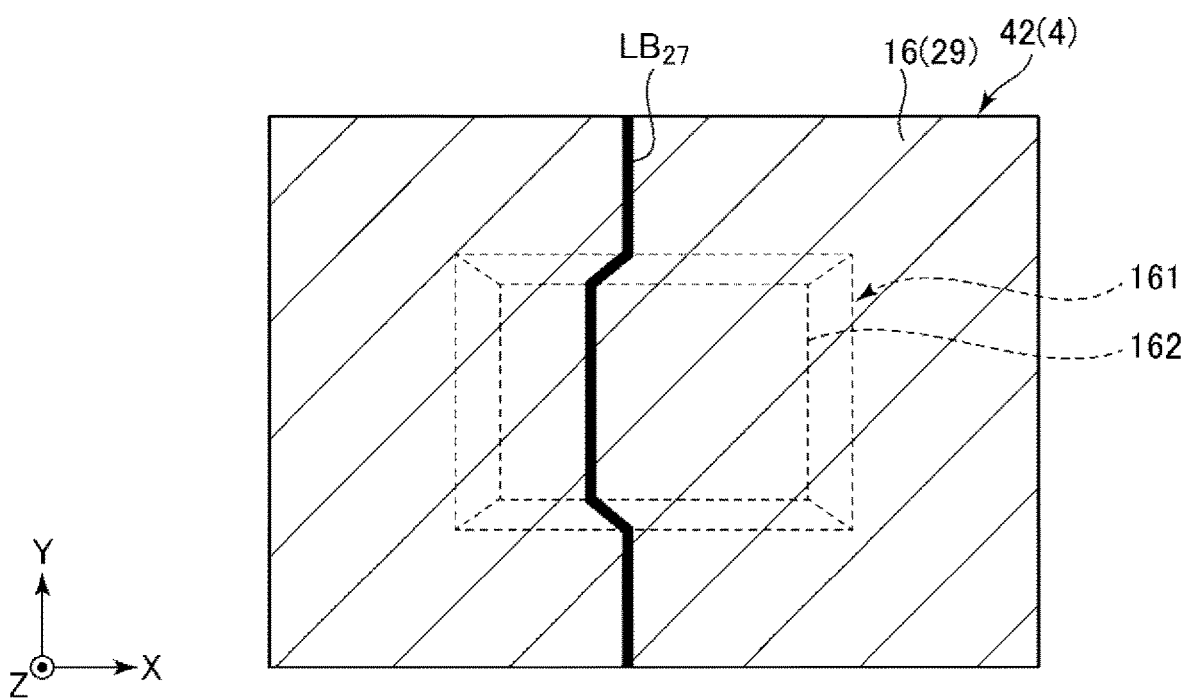
FIG. 9 is a second reference grayscale image (an example) used to determine whether an IC device is placed on the testing unit or not.

In the second reference grayscale image 42 shown in FIG. 9, the laser beam LB27 reaches the bottom part 162 of the recess 161 because no IC device 90 is placed in the recess 161. The second reference grayscale image 42 shows no boundary of luminance that can be regarded as a contour (edge) of the IC device 90.

It is now assumed that actual grayscale images as shown in FIGS. 10 to 13 are obtained as examples of the actual grayscale image 5.

Figure 10:
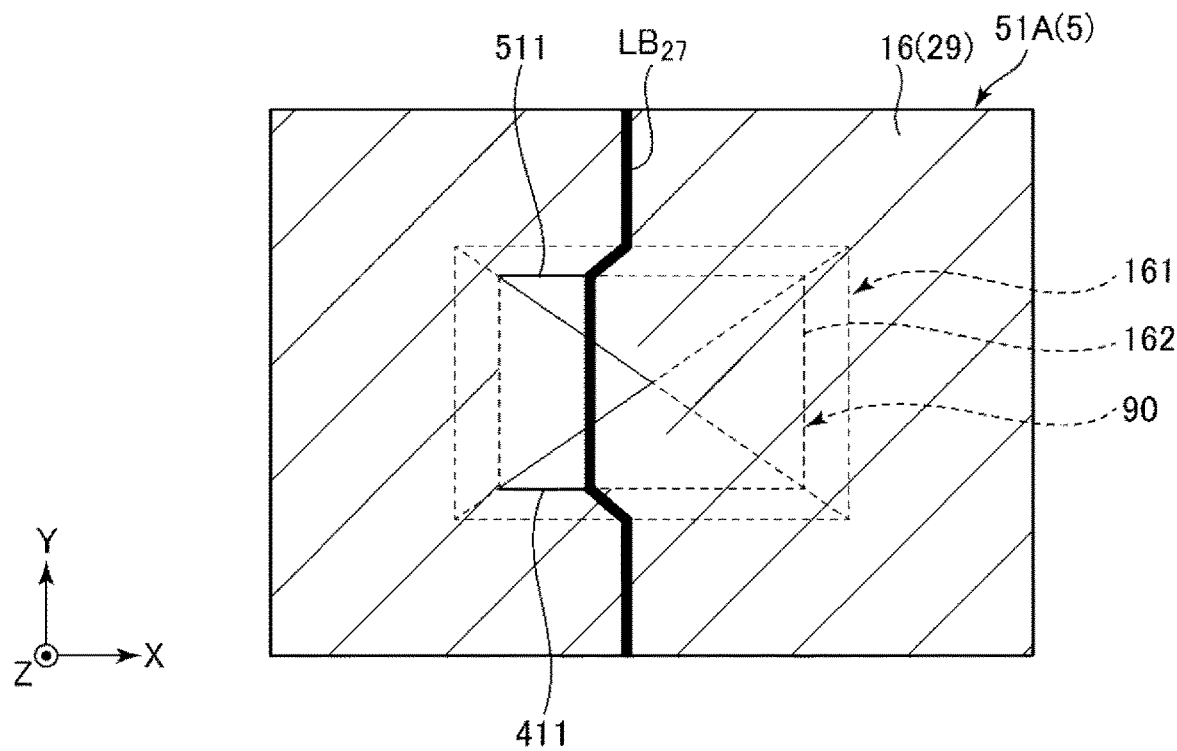
FIG. 10 is a grayscale image (an example) picked up by an image pickup unit when determining whether an IC device is placed on the testing unit or not.

In an actual grayscale image 51A shown in FIG. 10, a part of the upper surface of the IC device 90 is brightly illuminated with the laser beam LB27. With binarization, the boundary between the illuminated part and the other part, that is, the boundary 511 of luminance, stands out at least at one position. In the actual grayscale image 51A, this boundary 511 can be regarded as a contour (edge) of the IC device 90.

Figure 11:
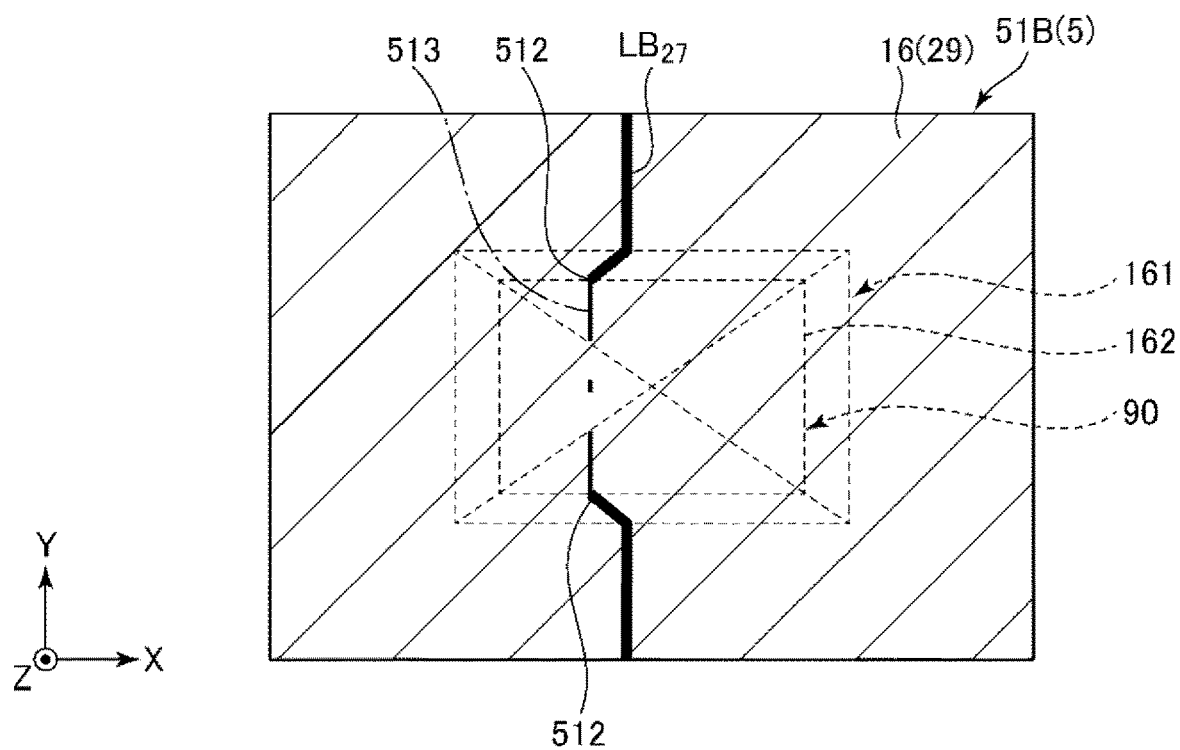
FIG. 11 is a grayscale image (an example) picked up by the image pickup unit when determining whether an IC device is placed on the testing unit or not.

In an actual grayscale image 51B shown in FIG. 11, the upper surface of the IC device 90 is less illuminated with the laser beam LB27 than the actual grayscale image 51A, but its peripheries are brightly illuminated with the laser beam LB27. With binarization, the boundary between the part brightly illuminated with the laser beam LB27 and the other part, that is, the boundary 512 of luminance, stands out at least at one position. In the actual grayscale image 51B, this boundary 512 can be regarded as a contour (edge) of the IC device 90. In the actual grayscale image 51B, a gently illuminated part 513 of the upper surface of the IC device 90 can be handled as a marker indicating the upper surface of the IC device 90.

In an actual grayscale image 51C shown in FIG. 12, a part of the upper surface of the IC device 90 is brightly illuminated with the laser beam LB27. With binarization, the boundary between the illuminated part and the other part, that is, the boundary 514 of luminance, stands out at least at one position. In the actual grayscale image 51C, this boundary 514 can be regarded as a contour (edge) of the IC device 90.

Figure 13:
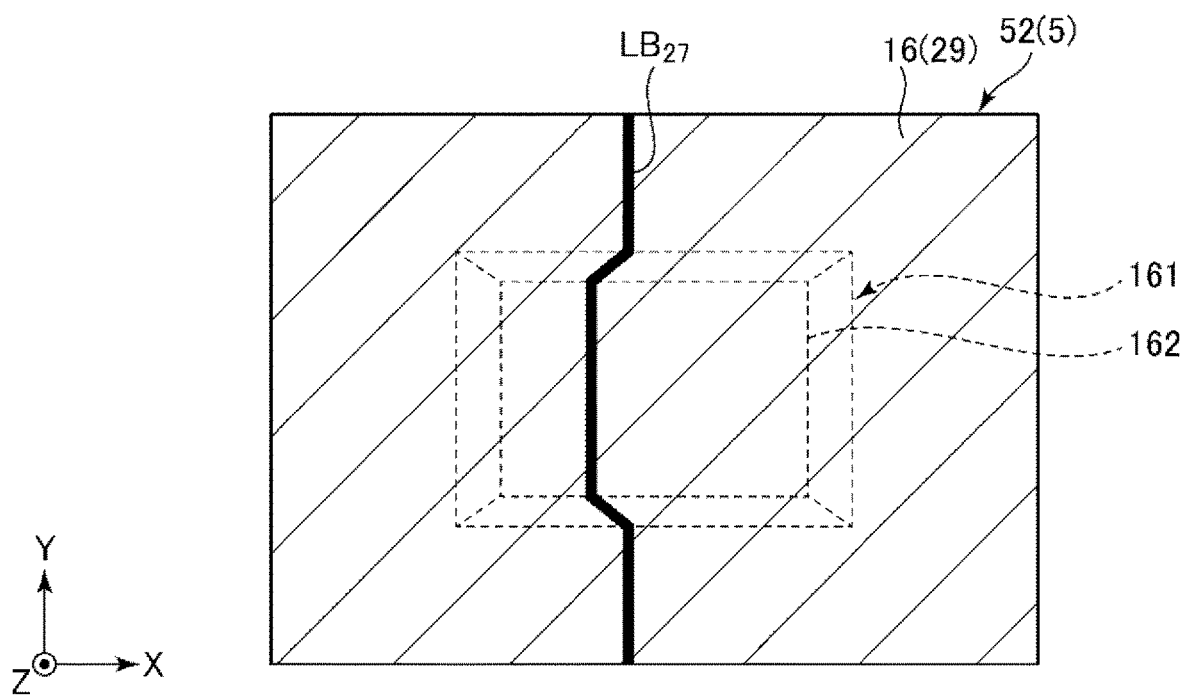
FIG. 13 is a grayscale image (an example) picked up by the image pickup unit when determining whether an IC device is placed on the testing unit or not.

In an actual grayscale image 52 shown in FIG. 13, the laser beam LB27 reaches the bottom part 162 of the recess 161 because no IC device 90 is placed in the recess 161. The actual grayscale image 52 shows no boundary of luminance that can be regarded as a contour (edge) of the IC device 90.

The determination processing in the case where each of the actual grayscale image 51A, the actual grayscale image 51B, the actual grayscale image 51C, and the actual grayscale image 52 is obtained will now be described.

First, when determining whether an IC device 90 (electronic component) is placed on the testing unit 16 (placing unit 29) or not, the determination unit 803 obtains the actual grayscale image 51A (grayscale image) of the testing unit 16 (placing unit 29) by causing the image pickup unit 26 to pick up an image of the testing unit 16 (placing unit 29) in the state where the laser beam irradiation unit 27 is casting the laser beam LB27 on the testing unit 16 (placing unit 29). The determination unit 803 then extracts the boundary 511 of luminance in the actual grayscale image 51A (grayscale image) by binarization. Next, the determination unit 803 compares the actual grayscale image 51A with the reference grayscale images 4 (first reference grayscale image 41A, first reference grayscale image 41B, first reference grayscale image 41C, and second reference grayscale image 42) and searches among the reference grayscale images 4 to find a reference grayscale image 4 (first reference grayscale image 41A) having a boundary that coincides with the boundary 511, for example, by template matching. If the result of the search is the first reference grayscale image 41A, the actual grayscale image 51A shown in FIG. 10 is regarded as closely resembling the first reference grayscale image 41A shown in FIG. 6 and it is determined that an IC device 90 is present on the testing unit 16. In this way, the determination unit 803 can accurately determines whether an IC device 90 (electronic component) is placed or not, based on the result of extracting the boundary 511. That is, the determination unit 803 can accurately carry out the determination processing. Thus, a shift to the next operation can be safely made in the test area A3.

Similarly, even when the actual grayscale image 51B is obtained, the boundary 512 of luminance in the actual grayscale image 51B can be extracted, as in the case of the actual grayscale image 51A. Next, the reference grayscale images 4 can be searched to find the first reference grayscale image 41B having a boundary that coincides with the boundary 512, for example, by template matching. If the result of the search is the first reference grayscale image 41B, the actual grayscale image 51B shown in FIG. 11 is regarded as closely resembling the first reference grayscale image 41B shown in FIG. 7 and it is determined that an IC device 90 is present on the testing unit 16. In this way, the determination unit 803 can accurately determine whether an IC device 90 is placed or not, based on the result of extracting the boundary 512. The determination unit 803 can also extract the part 513 in the actual grayscale image 51B and accurately determine whether an IC device 90 is placed or not, based on the result of the extraction.

Similarly, even when the actual grayscale image 51C is obtained, the boundary 514 of luminance in the actual grayscale image 51C can be extracted. Next, the reference grayscale images 4 can be searched to find the first reference grayscale image 41C having a boundary that coincides with the boundary 514, for example, by template matching. If the result of the search is the first reference grayscale image 41C, the actual grayscale image 51C shown in FIG. 12 is regarded as closely resembling the first reference grayscale image 41C shown in FIG. 8 and it is determined that an IC device 90 is present on the testing unit 16. In this way, the determination unit 803 can accurately determine whether an IC device 90 is placed or not, based on the result of extracting the boundary 514.

Meanwhile, when the actual grayscale image 52 is obtained, the actual grayscale image 52 shows no boundary of luminance that can be regarded as a contour of the IC device 90. Then, the reference grayscale images 4 can be searched to find the second reference grayscale image 42 coinciding with the actual grayscale image 52, for example, by template matching. If the result of the search is the second reference grayscale image 42, the actual grayscale image 52 shown in FIG. 13 is regarded as closely resembling the second reference grayscale image 42 shown in FIG. 9 and it is determined that an IC device 90 is absent from the testing unit 16. In this way, the determination unit 803 can accurately determine whether an IC device 90 is placed or not, based on the result of extracting a boundary (presence/absence of a boundary of luminance). The determination unit 803 can also accurately determine whether an IC device 90 is placed or not, based on the degree of resemblance between the actual grayscale image and the second reference grayscale image 42 in the irradiation shape (projection shape) of the laser beam LB27 on the testing unit 16.

Each of the reference grayscale image 4 and the actual grayscale image 5 is a picked-up image of the entirety of the recess 161. However, this is not limiting. A picked-up image of a part of the recess may be employed. Even in this case, when an IC device 90 is placed in the recess 161, it is preferable that a boundary of luminance that can be regarded as a contour of the IC device 90 is shown in the image.

If, for example, a plurality of recesses 161 is arranged along the X-direction, the angle of incidence of the laser beam LB27 varies from one recess 161 to another. A reference grayscale image 4 for each recess 161 is stored in the storage unit 802. To determine whether an IC device 90 is placed in each recess 161 or not, an image of each recess 161 is picked up to obtain an actual grayscale image 5, and the actual grayscale image 5 is compared with the reference grayscale image 4 corresponding to the recess 161 shown in this actual grayscale image 5. The determination can thus be carried out.

In the first embodiment, binarization is employed to extract the boundary 511 of luminance in the actual grayscale image 5 and to search among the reference grayscale images 4 to find a reference grayscale image 4 having a boundary that coincides with the boundary 511. However, for example, instead of binarization, grayscale conversion may be performed on at least one of the actual grayscale image 5 and the reference grayscale image 4 to carry out the extraction or the search. Also, a picked-up image without binarization may be used to carry out the extraction or the search. In any case, it is acceptable that the boundary 511 of luminance in the actual grayscale image 5 is extracted and that the reference grayscale images 4 are searched to find a reference grayscale image 4 having a boundary that coincides with the boundary 511.

In the first embodiment, a boundary of luminance in a grayscale image is extracted. However, instead of extracting the boundary, a different part between two images may be directly defined as a detection target. For example, if an IC device 90 has no recess or protrusion on its upper surface and the recess 161 has a recess or protrusion such as a pin, when the IC device 90 is present, the laser beam LB27 on the upper surface of the IC device 90 in a picked-up image appears in its irradiation shape such as a linear shape, dot-like shape or other mark-like shape. Meanwhile, when the IC device 90 is absent, the laser beam LB27 in a picked-up image may not appear in its irradiation shape but in a different shape such as in a dashed line, or may appear to be brightly illuminating the peripheries instead of having a shape, due to the recess or protrusion such as the pin. The irradiation shape of the laser beam LB27 such as a linear shape, dot-like shape, other mark-like shape, or dashed line, which is a difference between two images, may be directly defined as a detection target. Also, when the IC device 90 is absent, the shape of the boundary between the bottom part 162 and the wall of the recess 161 (pocket) may be defined as a detection target so as to determine that the IC device 90 is absent.

Moreover, any technique for comparing the actual grayscale image 5 with the reference grayscale image 4 in the state where an IC device 90 is present and the reference grayscale image 4 in the state where an IC device 90 is absent, may be employed. Any technique using a difference between an image in the state where an IC device 90 is present and an image in the state where an IC device 90 is absent, to determine the presence/absence of an IC device 90, may be employed.

For example, the first reference grayscale image 41A (first reference grayscale image 41B, first reference grayscale image 41C) may be a picked-up image in which the laser beam LB27 appears in its irradiation shape such as a linear shape, dot-like shape or other mark-like shape. The second reference grayscale image 42 may be a picked-up image in which the laser beam LB27 does not appear in its irradiation shape but in a different shape such as in a dashed line, or appears to be brightly illuminating the peripheries instead of having a shape.

Depending on the angle of the laser beam LB27 cast on the placing unit, the actual grayscale image 51A of FIG. 10 may turn into the actual grayscale image 51B of FIG. 11 even if the other conditions are the same. For example, if the placing unit 29 is near the light source of the laser beam LB27 (laser beam irradiation unit 27) and is irradiated with the laser beam LB27 at a large angle (that is, an angle closer to vertical), the actual grayscale image 51A as shown in FIG. 10 is obtained. If the placing unit 29 is far from the light source of the laser beam LB27 (laser beam irradiation unit 27) and is irradiated with the laser beam LB27 at a small angle (that is, an angle closer to horizontal), the actual grayscale image 51B as shown in FIG. 11 is obtained. In this case, different first reference grayscale images 41A, 41B, 41C may be used, depending on the position of the placing unit 29. The actual grayscale image 5 of the placing unit 29 near the light source of the laser beam LB27 (laser beam irradiation unit 27) may be determined, based on the first reference grayscale image 41A as shown in FIG. 6. The actual grayscale image 5 of the placing unit 29 far from the light source of the laser beam LB27 (laser beam irradiation unit 27) may be determined, based on the first reference grayscale image 41B as shown in FIG. 7. Determination may be carried out, based on different first reference grayscale images in advance.

Second Embodiment

Hereinafter, a second embodiment of the electronic component handler and the electronic component tester according to the invention will be described with reference to FIG. 16. Differences from the foregoing embodiment will be mainly described. Similar matters will not be described further.

This embodiment is similar to the first embodiment except that further patterns of determining the presence/absence of an IC device are added.

The electronic component tester 1 (electronic component handler 10) in this embodiment can carry out determination processing in three patterns.

In the first pattern, a change in the irradiation shape of the laser beam LB27 on the testing unit 16 between the state where an IC device 90 is present on the testing unit 16 and the state where an IC device 90 is absent from the testing unit 16 is extracted. Based on the result of the extraction, whether an IC device 90 is placed or not is determined.

In the second pattern, the irradiation with the laser beam LB27 is omitted and images of the testing unit 16 in the state where an IC device 90 is present on the testing unit 16 and in the state where an IC device 90 is absent from the testing unit 16 are picked up. Then, these images are compared with a reference image stored in advance in the storage unit 802, to determine whether an IC device 90 is placed or not.

The third pattern is the determination processing described in the first embodiment.

A control program to decide which of the first to third patterns is selected will now be described with reference to the flowchart of FIG. 16. It is preferable that the control program is stored in advance in the storage unit 802.

A menu (display) about whether to select the first pattern or not is displayed, for example, on the monitor 300 (step S101). If the operator selects the first pattern in step S101, the first pattern is executed (step S102).

If the operator does not select the first pattern in step S101, a menu (display) about whether to select the second pattern or not is displayed, for example, on the monitor 300 (step S103). If the operator selects the second pattern in step S103, the second pattern is executed (step S104).

If the operator does not select the second pattern in step S103, a menu (display) about whether to select the third pattern or not is displayed, for example, on the monitor 300 (step S105). If the operator selects the third pattern in step S105, the third pattern is executed (step S106).

If the operator does not select the third pattern in step S105, a notification that "none of the first to third patterns is selected" is given, for example, on the monitor 300 (step S107).

Instead of step S101, processing to determine whether the first pattern has been tried N times or not, and processing to calculate the rate of determination on the presence/absence of an IC device 90 in that processing may be inserted. It is preferable that step S102 is executed if the rate of determination is equal to or higher than a first threshold, and that the processing shifts to step S103 if the rate of determination is less than the first threshold.

Instead of step S103, processing to determine whether the second pattern has been tried N times or not, and processing to calculate the rate of determination on the presence/absence of an IC device 90 in that processing may be inserted. It is preferable that step S104 is executed if the rate of determination is equal to or higher than a second threshold, and that the processing shifts to step S105 if the rate of determination is less than the second threshold.

Instead of step S105, processing to determine whether the third pattern has been tried N times or not, and processing to calculate the rate of determination on the presence/absence of an IC device 90 in that processing may be inserted. It is preferable that step S106 is executed if the rate of determination is equal to or higher than a third threshold, and that the processing shifts to step S107 if the rate of determination is less than the third threshold.

The electronic component handler and the electronic component tester according to the invention have been described above, based on the illustrated embodiments. However, the invention is not limited to these embodiments. Each part forming the electronic component handler and the electronic component tester can be replaced with an arbitrary configuration that can achieve similar functions. Also, an arbitrary configuration may be added.

The electronic component handler and the electronic component tester according to the invention may be a combination of two or more arbitrary configurations (features) of the respective embodiments.

The entire disclosure of Japanese Patent Application No. 2017-212511, filed Nov. 2, 2017 is expressly incorporated by reference herein.

What is claimed is:

1. An electronic component handler comprising:
a placing plate on which an electronic component is placed;
a camera which picks up an image of the placing plate;
a light source of a laser beam which casts the laser beam on the placing plate;
a memory which stores in advance a reference image to serve as a reference for determining whether the electronic component is placed on the placing plate or not; and a processor,
wherein the processor
(a) causes the light source of the laser beam to cast the laser beam on the placing plate,
(b) causes the camera to pick up an image of the placing plate in a state where the light source of the laser beam is casting the laser beam on the placing plate, and
(c) determines whether the electronic component is placed on the placing plate or not, based on a boundary of luminance in the image of the placing plate;
wherein the reference image includes:
a first reference image acquired by causing the light source of the laser beam to cast the laser beam on the placing plate and causing the camera to pick up an image, in a state where the electronic component is present on the placing plate; and
a second reference image acquired by causing the light source of the laser beam to cast the laser beam on the placing plate and causing the camera to pick up an image, in a state where the electronic component is absent from the placing plate, and
wherein the processor compares the reference image and the image and thus determines whether the electronic component is placed or not.

2. The electronic component handler according to claim 1, wherein the first reference image includes a plurality of images with different irradiation conditions of the laser beam.

3. The electronic component handler according to claim 1, wherein the light source of the laser beam is configured to cast the laser beam having a linear irradiation shape on the placing plate.

4. The electronic component handler according to claim 3, wherein the placing plate has a recess where the electronic component is accommodated, and
the laser beam having the linear irradiation shape is cast across the recess.

5. The electronic component handler according to claim 1, wherein the light source of the laser beam is configured to cast the laser beam having a dot-like irradiation shape on the placing plate.

6. The electronic component handler according to claim 5, wherein the placing plate has a recess where the electronic component is accommodated, and
the laser beam having the dot-like irradiation shape is cast on a bottom part of the recess.

7. The electronic component handler according to claim 1, further comprising an auxiliary light which casts light with a lower illuminance than the laser beam toward the placing plate when the camera picks up the image of the placing plate.

8. An electronic component tester comprising:
a testing unit which has a placing plate on which an electronic component is placed and which tests the electronic component placed on the placing plate;
a camera which picks up an image of the placing plate;
a light source of a laser beam which casts the laser beam on the placing plate;
a memory which stores in advance a reference image to serve as a reference for determining whether the electronic component is placed on the placing plate or not; and
a processor,
wherein the processor
(a) causes the light source of the laser beam to cast the laser beam on the placing plate,
(b) causes the camera to pick up an image of the placing plate in a state where the light source of the laser beam is casting the laser beam on the placing plate, and
(c) determines whether the electronic component is placed on the placing plate or not, based on a boundary of luminance in the image of the placing plate;
wherein the reference image includes:
a first reference image acquired by causing the light source of the laser beam to cast the laser beam on the placing plate and causing the camera to pick up an image, in a state where the electronic component is present on the placing plate; and
a second reference image acquired by causing the light source of the laser beam to cast the laser beam on the placing plate and causing the camera to pick up an image, in a state where the electronic component is absent from the placing plate, and
wherein the processor compares the reference image and the image and thus determines whether the electronic component is placed or not.

9. The electronic component tester according to claim 8, wherein the first reference image includes a plurality of images with different irradiation conditions of the laser beam.

10. The electronic component tester according to claim 8, wherein the light source of the laser beam is configured to cast the laser beam having a linear irradiation shape on the placing plate.

11. The electronic component tester according to claim 10, wherein the placing plate has a recess where the electronic component is accommodated, and
the laser beam having the linear irradiation shape is cast across the recess.

12. The electronic component tester according to claim 8, wherein the light source of the laser beam is configured to cast the laser beam having a dot-like irradiation shape on the placing plate.

13. The electronic component tester according to claim 12, wherein the placing plate has a recess where the electronic component is accommodated, and
the laser beam having the dot-like irradiation shape is cast on a bottom part of the recess.

14. The electronic component tester according to claim 8, further comprising an auxiliary light which casts light with a lower illuminance than the laser beam toward the placing plate when the camera picks up the image of the placing plate.

* * * * *